US007660776B1

(12) United States Patent
Kious

(10) Patent No.: US 7,660,776 B1
(45) Date of Patent: Feb. 9, 2010

(54) SYSTEM FOR AUTOMATICALLY IDENTIFYING POWER SYSTEM TYPE AND IDENTIFYING LIKELY ERRORS OF WIRING AND CONNECTION

(76) Inventor: Kennebec Miles Kious, 2717 N. Main St., #15, Walnut Creek, CA (US) 94597

( * ) Notice: Subject to any disclaimer, the term of this patent is extended or adjusted under 35 U.S.C. 154(b) by 804 days.

(21) Appl. No.: 11/306,480

(22) Filed: Dec. 29, 2005

Related U.S. Application Data

(60) Provisional application No. 60/640,640, filed on Dec. 30, 2004.

(51) Int. Cl.
*G06F 17/00* (2006.01)
*G06N 5/00* (2006.01)
*G06N 5/02* (2006.01)

(52) U.S. Cl. ............... 706/45; 706/46; 706/47
(58) Field of Classification Search .............. 706/45
See application file for complete search history.

(56) References Cited

U.S. PATENT DOCUMENTS

| | | | | |
|---|---|---|---|---|
| 6,194,882 B1 * | 2/2001 | Mirow et al. | ............... | 323/282 |
| 6,282,941 B1 * | 9/2001 | Mader | ............... | 73/1.39 |
| 6,285,917 B1 * | 9/2001 | Sekiguchi et al. | ............... | 700/239 |
| 6,684,146 B1 * | 1/2004 | Hedenetz | ............... | 701/70 |
| 6,819,437 B2 * | 11/2004 | Spolaczyk | ............... | 356/624 |
| 6,858,791 B2 * | 2/2005 | Erban | ............... | 136/244 |
| 6,894,510 B2 * | 5/2005 | Schmidt et al. | ............... | 324/690 |
| 6,921,911 B2 * | 7/2005 | Siepmann | ............... | 250/577 |
| 6,976,503 B2 * | 12/2005 | Ens et al. | ............... | 137/552 |
| 7,316,153 B2 * | 1/2008 | Winkler et al. | ............... | 73/40 |
| 7,327,272 B2 * | 2/2008 | Ferraro | ............... | 340/612 |
| 7,336,068 B2 * | 2/2008 | Muller | ............... | 324/202 |
| 7,345,471 B2 * | 3/2008 | Sellen et al. | ............... | 324/207.12 |
| 7,487,057 B2 * | 2/2009 | Heilig et al. | ............... | 702/106 |

OTHER PUBLICATIONS

A digital signal-processing instrument for impedance measurement, Angrisani, L.; Baccigalupi, A.; Pietrosanto, A.; Instrumentation and Measurement, IEEE Transactions on vol. 45, Issue 6, Dec. 1996 pp. 930-934 Digital Object Identifier 10.1109/19.543988.*

Measurement, diagnostics and monitoring of partial discharges on high-voltage equipment on- line and off-line Sun Zhenquan; Zhao Xuefeng; Li Jisheng; Li Yanming; Industrial Electronics and Applications, 2009. ICIEA 2009. 4th IEEE Conference on May 25-27, 2009 pp. 1521-1526 Digital Object Identifier 10.1109/ICIEA.2009. 5138449.*

Software customization to provide digital oscilloscope with enhanced period measurement features D'Elia, M.G.; Liguori, C.; Pietrosanto, A.; Instrumentation and Measurement Technology Conference, 2004. IMTC 04. Proceedings of the 21st IEEE vol. 1, May 18-20, 2004 pp. 245-249 vol. 1 Digital Object Identifier 10.1109/ IMTC.2004.1351037.*

(Continued)

*Primary Examiner*—Michael B Holmes

(57) ABSTRACT

A system which automatically identifies a power system type, anomalies in the output of the power system, and/or likely errors of wiring and connection to the power system or a system under test connected to the power system is presented. A measurement processing module reduces measurement signals to characterized measurements and a rule base applies knowledge bases of standard power systems and wiring and connection errors to the processed measurements to determine the power system type, the most likely anomalies in the output of the power system, and/or the most likely wiring and/or connection errors.

92 Claims, 32 Drawing Sheets

OTHER PUBLICATIONS

Measuring Time Base Distortion in Analog-Memory Sampling Digitizers Attivissimo, F.; Di Nisio, A.; Giaquinto, N.; Savino, M.; Instrumentation and Measurement, IEEE Transactions on vol. 57, Issue 1, Jan. 2008 pp. 55-62 Digital Object Identifier 10.1109/TIM.2007.909600.*

* cited by examiner

SYSTEM FOR AUTOMATICALLY IDENTIFYING POWER SYSTEM TYPE AND IDENTIFYING LIKELY ERRORS OF WIRING AND CONNECTION

BACKGROUND OF THE INVENTION

The present invention is related to power system analysis and, more particularly, to systems which can automatically identify the power system type and likely errors of wiring and connections in the power system.

One of the biggest problems in measuring aspects of electrical circuits is simply the avoidance of errors. For example, errors in the wiring of an electrical circuit connected to a power system are not obvious, but they can drastically affect the resulting measurements of the circuit. Errors in connecting measurement sensors to the circuit are quite common and often result in unusable measurements or misinformation.

Traditionally, such errors are minimized by the knowledge, training and experience of a person, a professional who makes the proper test connections to the circuit and then evaluates the preliminary measurements to determine if the wiring, connections, setup, and operating modes are correct. Based on these preliminary measurements, the professional then makes the necessary corrections. The manufacturers of test equipment have also attempted to minimize errors by: educating the professional with sufficient information so that he or she can make informed decisions on existence of errors and what to do to rectify the errors; requiring the professional to specify the type of power system under analysis and then, based on the specification, possibly indicating to the professional some limited level of error detection; or constraining the professional to hook up the test equipment to only a small number of basic power system types.

Heretofore, a major problem, if not the major problem, with error detection and interpretation has been that there is often more than one possible explanation for a given set of input signals to the test equipment. For instance, if the voltage from A phase to neutral ($V_{an}$) appears to be 120V, the B phase voltage to neutral ($V_{bn}$) appears to be 120V, and the C phase voltage to neutral ($V_{cn}$) appears to be 0V, there are several likely explanations:

1) the user is measuring a 2-phase circuit and should measure the phase-to-phase voltage, $V_{ab}$, of 240V;

2) the user is measuring 2 different single phase circuits and all setups are correct;

3) the user is measuring 1 single phase circuit and the ground lead is not connected;

4) the user is measuring a 3-phase Wye circuit and the C phase is not connected;

5) the user is measuring a 3-phase Delta circuit and the C phase is not connected; or 6) the user is measuring a 3-phase, 4-wire Delta circuit and the C phase has not been connected.

Furthermore, complexity is multiplied when current inputs to the test equipment are also considered. Since a the phase of a current can lead its associated voltage by up to 90 degrees or can lag the associated voltage by up to 90 degrees, if the current sensor is installed backwards, the current leads its voltage from 90 to 270 degrees. In a three-phase power system, each voltage phase is typically 120 degrees apart. Hence, if a current is seen to lag a voltage by 60 degrees, there are several possibilities:

1) the current is lagging its voltage by 60 degrees;

2) the current sensor is misconnected and it should be matched to the next voltage phase, which it leads by 60 degrees; or 3) the current sensor is installed backwards and is misconnected. It should be paired with the third phase, with which it is actually in phase.

Identification of a power system is further complicated by the fact that there are multiple "standard" power systems and multiple configurations of standard power systems. For instance, at 60 Hz, there are several standard three-phase, phase-phase systems, such as 120V, 208V, 240V, 480V, 600V, 4160V, 12470V, 13800V, etc. At 50 Hz and 400 Hz, there are several more standard three-phase, phase-phase systems. By adding consideration of a neutral, there are many more three-phase, phase-neutral systems, such as a 120V Wye system. And to complicate matters even more, there are two-phase systems, single-phase systems, DC systems, and the four-wire Delta system with its asymmetric voltage levels and phase angles between phases. All considered, there are dozens of unique standard power delivery systems in use in the world.

Another difficulty in identifying a power system is that most systems are not ideal. For example, in an ideal three-phase power system, all voltages are equal and nominally non-varying. The voltages have a specific frequency with a fixed phase relationship with respect to each other. A particular power delivery system might have 480 $V_{rms}$ phase-to-phase at 60 Hz with 120 degrees between each of the phases and the current of each of the phases would be expected to lag its associated voltage by the same number of degrees as in the other phases. All currents would have essentially the same magnitude. But individual voltages typically vary from moment to moment, as do currents and phase angles between voltages and their associated currents. Even the frequency can vary in some systems. A non-ideal system must be recognized and a varying one must not be confused with a similar but different system. A judgment must be made whether the system is standard or non-standard, because there are non-standard systems and sometimes errors cause standard systems to operate outside of acceptable bounds.

To complicate matters even further, there may be errors in the connection of the measurement devices to the system or in the wiring of the system itself, as often happens with temporary measurements of a power system. In such cases, it can be very difficult to recognize a power system. When measuring power, it can be impossible to state with certainty what type of power system is present, whether the connections to the power system are correct, and what errors have been made in the wiring or connections to the power system. For instance, if three current sensors are rotated (connected by one phase off so that A phase is connected to B phase, B phase is connected to C phase, and C phase is connected to A phase), it could appear to be the same as if the sensors were connected to the correct phases, but were installed backwards. Resolution of such issues requires experienced judgment.

Therefore, a need exists for a system that can automatically determine the most likely power system that is connected to a circuit or system under test and the most likely connection or wiring errors present when taking the measurements. To address these issues and problems, the present invention combines methods of interpreting measurements, methods of analysis, and methods of using power system databases, and rules from an artificial intelligence knowledge base in order to make better judgments about the correctness of the wiring and connections, perhaps as well as or even better than a typical knowledgeable professional, and then to communicate the most likely errors (if any) to the user for a clear statement of likely remedial steps which are warranted. The present invention uses artificial intelligence applied to a knowledge base and interpretation of a set of measurements to determine the most likely power system that is connected and the most likely connection or wiring errors present.

SUMMARY OF THE INVENTION

The present invention provides for a unitary device for evaluating measurement signals of a power system or a system under test. The unitary device has a plurality of input terminals into the device for receiving the measurement signals; an identification subsystem reducing the measurement signals to characterized measurements and analyzing the characterized measurements with applied knowledge and rule bases to determine the type of the power system, any anomalies in the output of that power system, and/or any likely errors in wiring or connection; and a reporting subsystem receiving the determination results from the identification system and reporting out the determination results.

The present invention also provides for a computer system for evaluating measurement signals of a power system or to a system under test. The computer system has at least one processor; a memory storing the measurement signals; an identification subsystem program instructing the processor to reduce the measurement signals to characterized measurements and to analyze the characterized measurements with applied knowledge and rule bases to determine the power system type of the power system, any anomalies in the output of that power system, and/or any likely errors in wiring or connection; and a display receiving the determined results from the identification system program and displaying the determined results to report out the same.

In a system for evaluating measurement signals of a power system or a system under test, the system has a processor. The present invention provides for code which instructs the processor to perform operations. The code has a module for reducing the measurement signals to characterized measurements; a knowledge base of power system types; a rule base with rules by which the knowledge base of power system types is to be applied in a systematic manner; and a module for processing the characterized measurements by applying the knowledge and rule bases to determine the type of power system of the power system, any anomalies in the output of that power system, and/or any likely errors in wiring or connection.

In a system for evaluating measurement signals of a power system or a system under test, the present invention provides for a method which has the steps of collecting measurement signals of the power system or the system under test; reducing the measurement signals to characterized measurements; and analyzing the characterized measurements including applying a knowledge base of power system types and a rule base with rules by which the knowledge base of power system types is applied in a systematic manner to determine the type of power system, any anomalies in the output of that power system, and/or any likely errors in wiring or connection.

BRIEF DESCRIPTION OF THE DRAWINGS

The accompanying drawings, which are incorporated into and constitute a part of this specification, illustrate one or more embodiments of the present invention and, together with the detailed description, serve to explain the principles and implementations of the invention.

The drawings include.

DESCRIPTION OF SPECIFIC EMBODIMENTS

Those of ordinary skill in the art will realize that the following detailed description of the present invention is illustrative only and is not intended to be in any way limiting. Other embodiments of the present invention should readily suggest themselves to such skilled persons having the benefit of this disclosure. Reference will now be made in detail to implementations of the present invention as illustrated in the accompanying drawings. The same reference indicators are used throughout the drawings and the following detailed description to refer to the same or like elements.

Context of the Present Invention

Figure 1A:
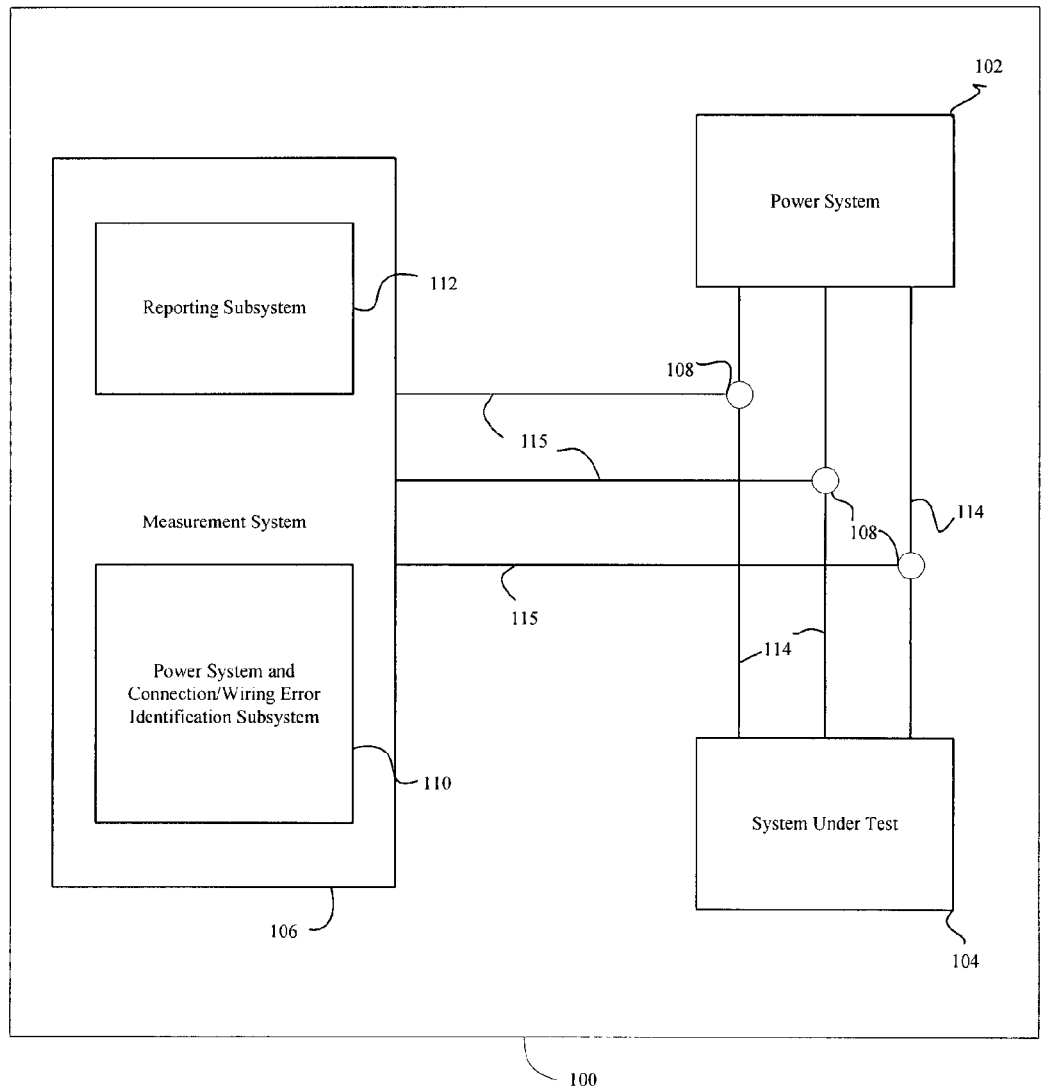
FIG. 1A is a block diagram schematically illustrating a power and error detection system in accordance with one embodiment of the present invention.

FIG. 1A representationally illustrates the context of the present invention. A total system 100 includes a power system 102, an optional system under test 104 which is connected to the power system 102, a measurement system 106, and sensing components 108. The power system 102 may be connected to the system under test 104 by one or more wires 114 with the sensing components 108 coupled to the wires 114. The measurement system 106 receives a set of measurements from the sensing components 108 on signals paths 115. The system under test 104 may be a device, such as a motor; an enterprise, such as a building; a power supply, such as a power grid or a generator; a set of measurement points, or any other active or passive entity that sources or consumes power.

The sensing components 108 may be electrically connected to the wires 114 for measuring voltage (at least two sensing components may be needed), or may be magnetic field sensors on individual wires 114 to measure current. The sensing components 108 may also include CTs (current transformers) for measuring current or PTs (potential transformers) for measuring voltage. Other sensors, such as Hall effect sensors, may also be used for these purposes. The described sensors are only examples and are not intended to be limiting. Of course, other types of sensing components may be used.

The measurement system 106 includes a system type and error identification subsystem 110 and a reporting subsystem 112 in accordance with one embodiment of the present invention. The system type and error identification subsystem 110 includes software/firmware which applies analysis and artificial intelligence to the set of measurements in order to identify what type of power system is attached, any anomalies in the output of that power system, and what connection or wiring errors exist in the total system 100. With the use of a knowledge base and a rule set, the subsystem 110 can examine a basic set of measurements of a power system or a system under test and determine the power system type, any anomalies in the output of that power system, and/or the most likely errors that are present, or to confirm that the system, connections, and wiring appear to be correct. The components of system type and error identification subsystem 110 are described in more detail in FIG. 2; and the algorithms and processes of the subsystem 110 are described in more detail in FIGS. 3-9.

The reporting subsystem 112 of the measurement system 106 includes some means for communicating the results of the analysis, such as a display or other output. In one embodiment, the reporting subsystem 112 includes an iconic display. Or, in another embodiment, the reporting subsystem 112 could include a display of text messages, a database of codes, or some other means for communicating the determined power system type, any anomalies in the output of that power system, and any connection errors.

Figure 1B:
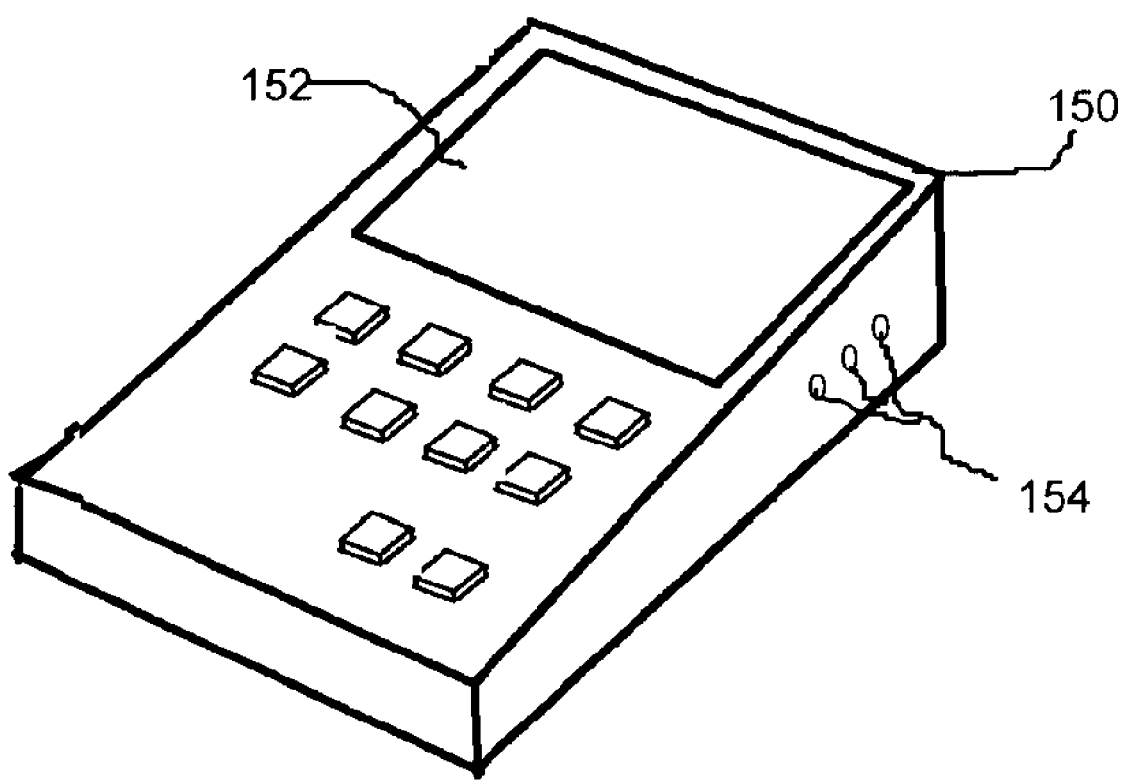
FIG. 1B is a representation of a power analyzer tool incorporating an embodiment of the present invention.

The measurement system 106 may be a unitary device, e.g., a power analyzer tool which incorporates the system type and error identification subsystem 110 as firmware and the reporting subsystem 112 as an integrated display. As shown in FIG. 1B, the tool is illustrated as a handheld device 150 with an LCD display 152. The device has input terminals 154 for the signal paths 115 for the measurement signals from the sensors 108 connected to the power system 102 and/or the system under test 104. A processor with connected memory (not shown) which includes the subsystem 110 firmware in the device 150 operates according to the subsystem 110 to determine the power system type, the most likely errors that are present or the correctness of the connections and wiring, and to report these results on the display 152.

Figure 1C:
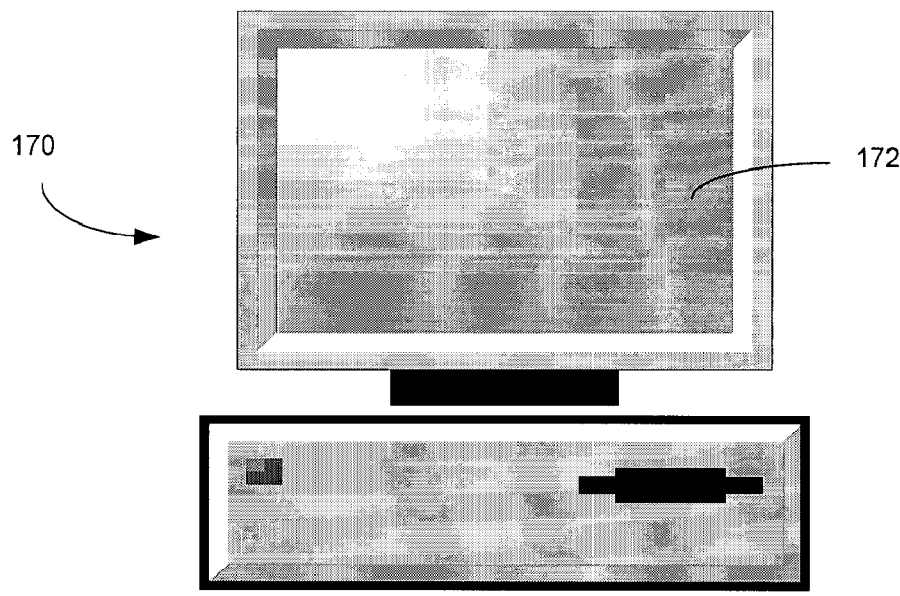
FIG. 1C is a representation of a general computer incorporating another embodiment of the present invention.
Figure 1D:
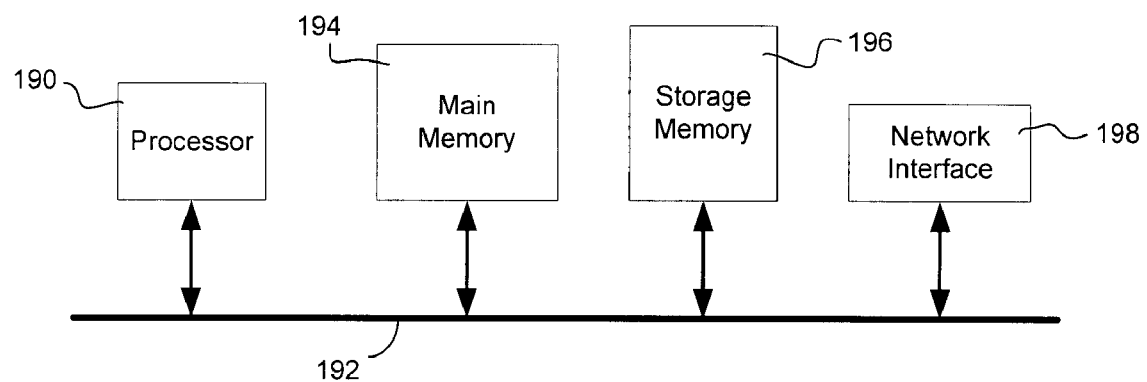
FIG. 1D is a representation of the internal architecture of the FIG. 1C general computer.

Alternatively, instead of such a specialized tool, a general computer might be used. In the latter case, the software of the subsystem 110 is stored in the memory (not shown) of the computer 170 illustrated in FIG. 1C. The computer 170 may receive the measurement signals either directly from the sensors 108 connected to the power system 102 and/or system under test 104, as in the case of the power analyzer tool, or sometime later. Upon instructions, a processor(s) (shown in FIG. 1D) of the computer 170 operates on the measurement signals under control of the subsystem 110 software and the results shown in a computer display 172. Of course, these are only two of many other arrangements of the measurement system 106.

The computer 170 might have an architecture illustrated in FIG. D. In this typical architecture, one or more processors represented by the processor 190 are connected to a main memory 194 (of semiconductor memory devices, such as DRAMs) by a bus 192. For more permanent storage of data or instructions, a storage memory 196, such as one or more disk drives, is also connected to the processor 190 by the bus 192. A network interface 198 further provides access to other computers or data sources. The architecture might be used for the power analyzer tool of FIG. 1B, but in this case the elements of the architecture can be optimized for its specialized use. For example, the size of the memory units 194 and 196 might be reduced and an input terminal interface connected to the bus 192 might be added for the input terminals 154.

In accordance with the present invention, an artificial intelligence rule set is employed to identify the most likely explanation for the current phase relationships that are present.

Figure 2:
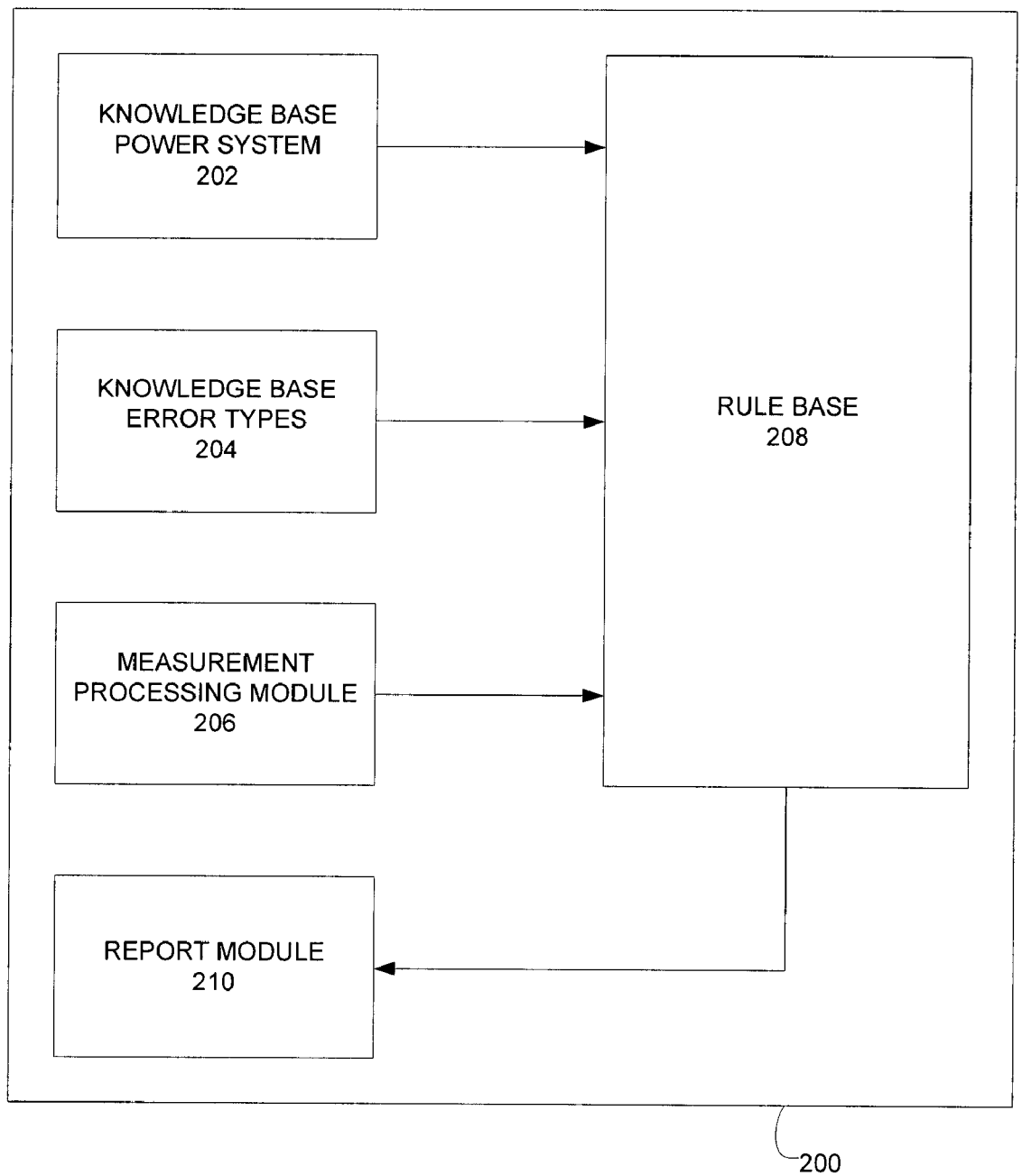
FIG. 2 is a block diagram schematically illustrating a system for automatically identifying power system type and identifying connections problems in accordance with an embodiment of the present invention.

FIG. 2 is a diagram that schematically illustrates the subsystem 110 for automatically identifying power system type, any anomalies in the output of that power system, and wiring or connection problems in the measurement system 106, in accordance with one embodiment of the present invention. The subsystem 110 includes a knowledge base of standard power systems 202, a knowledge base of error types 204, a measurement processing module 206, a rule base 208 for applying knowledge base to the processed measurements in order to predict most likely error scenarios, and the report processing module 112. The knowledge base of standard power systems 202 includes characteristics common to specific power system types based on a basic measurement set. FIGS. 5 and 6 illustrate data in the knowledge base of standard power systems 202.

The knowledge base of error types 204 includes most, if not all, types of errors that may be present in the system 100 and what the effect of each error type is on measurements. The following is a list of examples of common errors that may be present in the power system 102 and system under test 104 which are connected to the measurement system 106:

1) one, two, or three voltages not connected
    2) one, two, or three currents not connected to source
    3) one, two, or three currents not connected to measuring system
    4) two or three connections to the same voltage
    5) two or three connections to the same current
    6) voltages misidentified
    7) currents misidentified
    8) one, two, or three current sensors backwards
    9) two voltage connections switched
    10) two current sensors switched
    11) all voltages rotated one position left
    12) all voltages rotated one position right
    13) all currents rotated one position left
    14) all currents rotated one position right
    15) one phase not present
    16) two phases not present
    17) three phases not present
    18) one phase offered as two or three phases
    19) one phase shorted to neutral or ground
    20) two phases shorted to neutral or ground
    21) neutral not connected to ground
    22) non-standard voltage due to improper loading
    23) non-standard voltage due to power system problem
    24) non-standard frequency due to power system problem
    25) non-standard phase shift between phases due to power system problem; and
    26) combinations of the above listed errors.

The measurement processing module 206 accepts measurements, such as voltages, currents, frequencies, and phase relationships which can be of any value and characterizes them as lying between certain ranges of measurements. This cuts down the number of instances to be evaluated by the rule base 208 from infinite to a manageable number of instances. For instance, a frequency within the range of 59 Hz to 61 Hz might be characterized as 60 Hz or a phase lag of 123.4 degrees might be characterized as being in the range of 115 to 125 degrees. Or if Van and Vbn are less than two volts, they may be characterized as being 0V, whereas if Vcn is 125 volts, it may be characterized as 120V. In such a case, the voltage system might then be further characterized as vltTyp=1, meaning that Van=Vbn=0 and Vcn>0.

The rule base 208 provides the rules by which the knowledge bases 202 and 204 are applied in a systematic manner. For instance, as in the previous example, if the voltage system is characterized as vltTyp=1, then the rule base decides that any three-phase system is likely not present. If only 1 current is present, then it decides that the most likely scenario is that the measurement system 110 is connected to a single phase voltage source and the Va and Vc connections have been reversed. If the single current that is present is not Ia, it assumes that the current connections have been switched. If the phase angle between the current and the voltage have been characterized to be 180 degrees, it assumes that the current probe is reversed. This relatively simple example gets greatly complicated if 2 currents are present because it might now be any one, two, or three-phase system. The rules base applies the characterized measurements and knowledge bases to its rules base to determine the most likely system that it is connected to and the most likely errors that are present.

The report module 210 reports out the determination of the system type and wiring and connection errors. These determinations are sent to the reporting subsystem 112 (shown in FIG. 1) for communication, such as by a display, for example, to the user of the measurement system 106.

General Operations of System Type and Error Identification Subsystem

Figure 3:
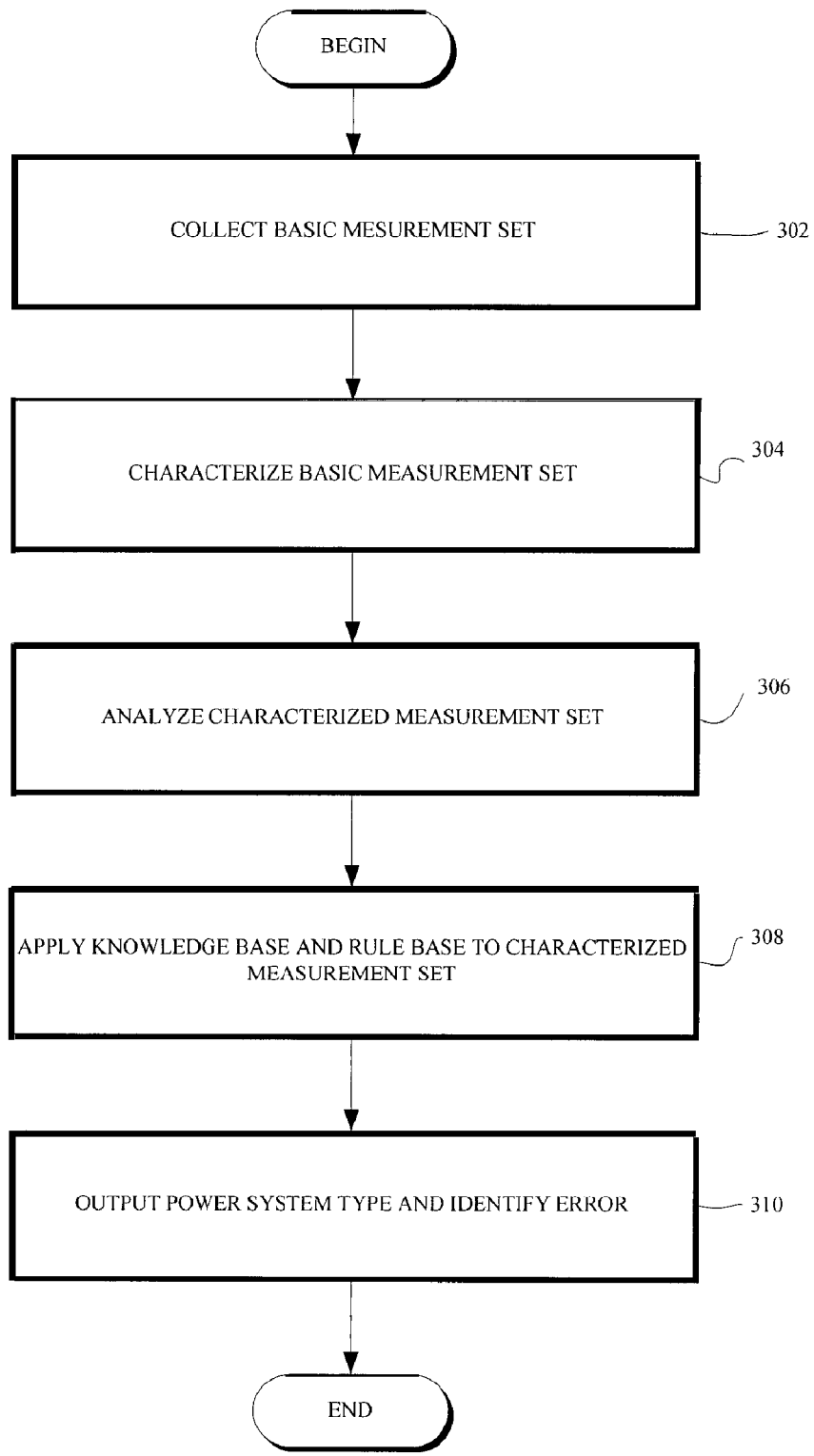
FIG. 3 is a general flow diagram of a method for automatically identifying power system type and identifying connections problems in accordance with an embodiment of the present invention.

FIG. 3 is a flow chart of the general simplified operations of the system type and error identification subsystem 110. General step 302 collects a set of basic measurements; the measurements of the set are then characterized in general step 304; general step 306 further characterizes the characterized measurements into general categories, such as voltage arrangement type and current arrangement type. General step 308 applies the rule base 208 to the characterized measurements 206, using the power system knowledge base 202 and the wiring/connection knowledge base 204 (shown in FIG. 2); and the determination of the power system type and error identification is reported out by general step 310. The operations and functions of these general steps 302, 304, 306, 308 and 310 are described in greater detail below.

A set of measurements are required of the power system and system under test as shown in FIG. 1A. For general step 302, the following measurements are desirable to determine common types of power systems and a fewer number of measurements are required where identification of all types of power systems (such as identifying only single phase power systems) are not required. Fewer measurements are also satisfactory if connections to current are not important. In addition, fewer measurements may be used to do a substantially accurate (but not complete) identification of the power system and connection errors. The following exemplary measurements are useful for power system type and error identification, according one embodiment of the present invention:

$V_{an}$—RMS voltage between A phase and neutral connections $V_{bn}$—RMS voltage between B phase and neutral connections $V_{cn}$—RMS voltage between C phase and neutral connections $V_{ab}$—RMS voltage between A phase and B phase connections $V_{bc}$—RMS voltage between B phase and C phase connections $V_{ca}$—RMS voltage between C phase and A phase connections $I_{a}$—RMS current of the A phase $I_{b}$—RMS current of the B phase $I_{c}$—RMS current of the C phase $I_{n}$—RMS current of the N phase Hz—frequency of each signal Phase lag between $V_{bn}$ and $V_{an}$ Phase lag between $V_{cn}$ and $V_{bn}$ Phase lag between $V_{an}$ and $V_{cn}$ Phase lag between $I_b$ and $I_a$ Phase lag between $I_c$ and $I_b$ Phase lag between $I_a$ and $I_c$.

Phase lag between $I_a$ and $V_{an}$

Phase lag between $I_b$ and $V_{bn}$

Phase lag between I and $V_{cn}$

Phase lag between $I_a$ and $V_{bn}$

Phase lag between $I_a$ and $V_{cn}$.

The number of possible combinations of measured voltages, currents, and phase angles are astronomical, and when combined with the unintended effects on measurements that result from connection errors, the identification of power systems and connection errors becomes formidable, if not impossible, for an automated system. To perform this task, step 304 reduces the measurement set to characterized measurements in order to make analysis possible:

1) Frequency is characterized as a specific standard (e.g., 50 Hz, 60 Hz, 400 Hz, or DC) or as a non-standard frequency.

2) Voltage magnitudes are evaluated to determine if they should be considered dead or alive.

3) Live voltage magnitudes are evaluated to determine which if any are roughly equivalent.

4) Current magnitudes are evaluated to determine if they should be considered dead or alive.

5) Live current magnitudes are evaluated to determine which if any are roughly equivalent.

6) Phase angles between the voltages are characterized as specific standard angles ("phsTyp") or as non-standard.

7) Phase angles between the currents are characterized as specific standard angles ("phsTyp") or as non-standard.

8) The difference in the phase lag between a voltage and its current and the phase lag of its adjoining voltages and currents is evaluated into several standard angle differences ("phsAngTyp") or as non-standard.

9) Voltage configurations are evaluated as one of several possible voltage arrangement types ("vltTyp").

10) Current configurations are evaluated as one of several possible current arrangement types ("curTyp").

11) Phase lags between voltages and currents are characterized as valid or invalid, depending on whether the signals are live or not.

In performing the analysis of the characterized measurements by step 306, it is important that connection and wiring errors be identified. Errors in making connections to a power system and errors in the wiring of the power system can make it impossible to identify a power system with any certainty. When aspects, such as the voltage, current, and power, being delivered by the power system to the system under test, are measured whether for a single reading or for long-term monitoring, any connection or wiring error yields incorrect or partial measurements that can have major consequences. As described above, the traditional approach requires a knowledgeable person to initially verify the wiring and to evaluate the measurements, waveforms or phasor diagrams in order to spot errors in the connections. Any mistakes or misunderstanding by that person regularly results in useless or damaging measurements and decisions being made with a great loss of time and opportunity.

The problem is that there is no deterministic way of identifying connection, wiring, and setup errors. Rather, in accordance with the present invention, the general analysis step 308 examines a set of characterized measurements and then applies a knowledge base and a rule set to determine the most likely errors that are present or to confirm that the connections and wiring appear to be correct.

The general step 306 first identifies the voltage and current arrangements of the attached power system. After the general step 308 determines the likely identity of the attached power system, the simplified symbolic measurements (e.g., vltTyp, curTyp, phsTyp, etc.) are compared to the symbolic measurements of the ideal form of the power system, and the most likely anomalies in the output of the power system and the most likely wiring and connection errors present are then determined.

For example, the most difficult errors to identify are situations where current sensors are reversed (reversed polarity), switched (two sensors are looking at the other sensor's current), rotated (all sensors are looking at the wrong phase), and/or disconnected, or combinations of these possibilities. The problem is that for most measurement sets there are multiple explanations for the measurements. What may appear to be an error may actually be correct and what may appear to be correct may actually be in error. For instance, if connections are made to a three-phase system and measurements reveal that the voltages and currents are perfectly balanced, the phase lags are constant, and for each phase pair the current lags the voltage by a respectable 1 degree, this could have resulted from correct connections to the described system or it could have also resulted from having the current sensors rotated one position (connections off by one phase, i.e. A phase current sensing to B phase line, and so on) and having each of the sensors also connected backwards.

Judgment is required to determine the most likely possibility. An artificial intelligence rule set is employed (general step 308) to identify the most likely explanation for the current phase relationships that are present.

Finally, general step 310 explains each deviation in a report of possible errors.

It should be noted that in reduced embodiments of the present invention, if the type of power system is already specified, the general step 308 identifies the most likely anomalies in the output of the power system and the most likely wiring and connection errors. That is, a user can specify the power system type and a less general version of the subsystem 110 of FIG. 1 can identify the power system output anomalies, and errors in wiring and connection. The knowledge base of power systems 202 of FIG. 2 is not required. Similarly, limited and directed versions of the subsystem 110 can be used with specific power system type to obtain identification of power system output anomalies, and wiring and connection errors.

Detailed Operations of General Steps 302, 304, 306 and 308

FIGS. 4A-4C, 5A-5I, 6, 7, 8A-8C and 9A-9I are flow charts which detail the operations of the system type and error identification subsystem 110 of FIG. 1A, and specifically, general steps 304, 306, 308 and 310 of FIG. 3.

The following symbols and conventions which are used in the flow charts of the drawings:

= exactly equal
~ approximately equal in magnitude (i.e. "characteristically equivalent")
> magnitude greater than
< magnitude less than
!= not equal to
!~ not approximately equal in magnitude
>> much greater than Dsig where "sig" is a signal name, such as Van. This is the number of degrees of phase offset of the fundamental frequency of the signal, referenced to a fixed point in time. The basic measurement from which all other phase measurements are derived.

Dsig,sig where "sig" is a signal name, such as Ia. The 'n' of voltage signal names, such as Van, are dropped off from this notation. This is the phase angle between the fundamental components of two signals. It is found be taking the Dsig of one signal and subtracting it from the Dsig of another signal. If the result is less than zero, 360 is added to it.

vltTyp based on magnitudes, the assortment of voltages that have been measured are condensed to a symbolic notation that describes their rough equivalence to zero and to each other. This is the apparent voltage arrangement. This allows effective analysis by the rules based system.

curTyp based on magnitudes and frequency, the assortment of currents that have been measured is condensed into a symbolic notation that describes their rough equivalence to zero and to each other. This is the apparent current arrangement. This allows effective analysis by the rules based system.

phsTyp[sig,sig] a symbolic notation where a Dsig'sig is transformed into one of a fixed number of phase angles to be used by the methods. For instance, if Dvavb=122, the phsTyp [Va,Vb] is 120.

sysTyp a symbolic notation representing a specific standard or non-standard power system type.

phsDif[phs,phs] the difference between the phase lag of two different phases. The phase lag between the voltage and current of one phase, for instance, Diava, is subtracted from the phase lag between the voltage and current of another phase, for instance, Dibvb, to yield the difference, such as phsDif[ab].

phsDifTyp[phs,phs] a symbolic representation of the phsDif of two phases. phsDif[phs,phs] is characterized as one of several "standard" angles that then allows the rules based system to evaluate current sensor connection problems.

Error[code] call to the "error" routine that accumulates the error messages and reports them to the user when appropriate. "Code" is the specific error being communicated.

CheckXv[sig] call to the "checkXv" routine (where "X" can be 1, 2, or 3), using "sig" as the reference signal.

Check3i[4] call to the check3i routine, with the indication that it is to be evaluated as a 4 wire delta system.

Figure 4A:
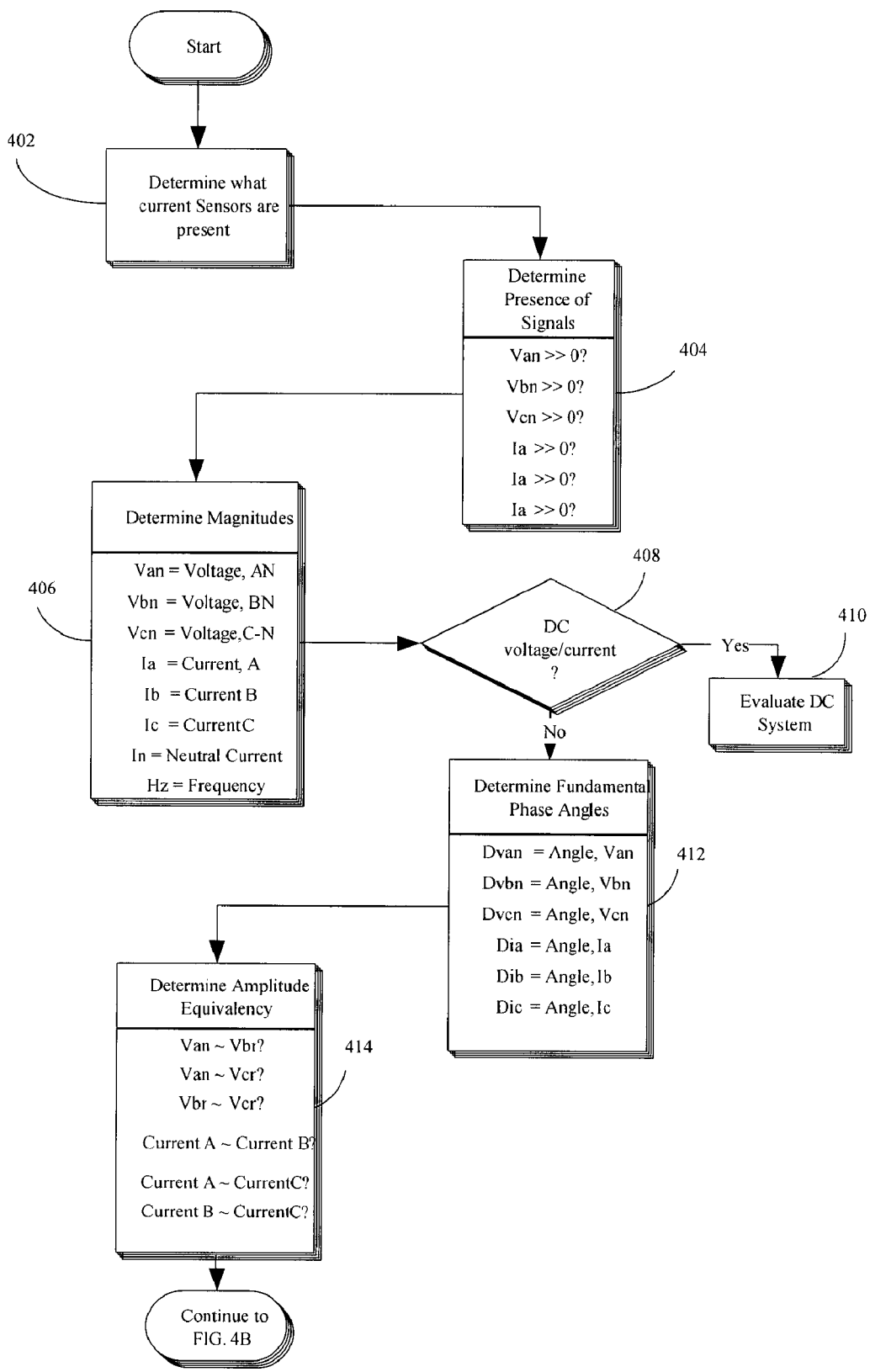
FIGS. 4A-4C illustrate a flow diagram of a method for characterizing a set of measurements from a power system in accordance with one embodiment of the present invention.
Figure 4B:
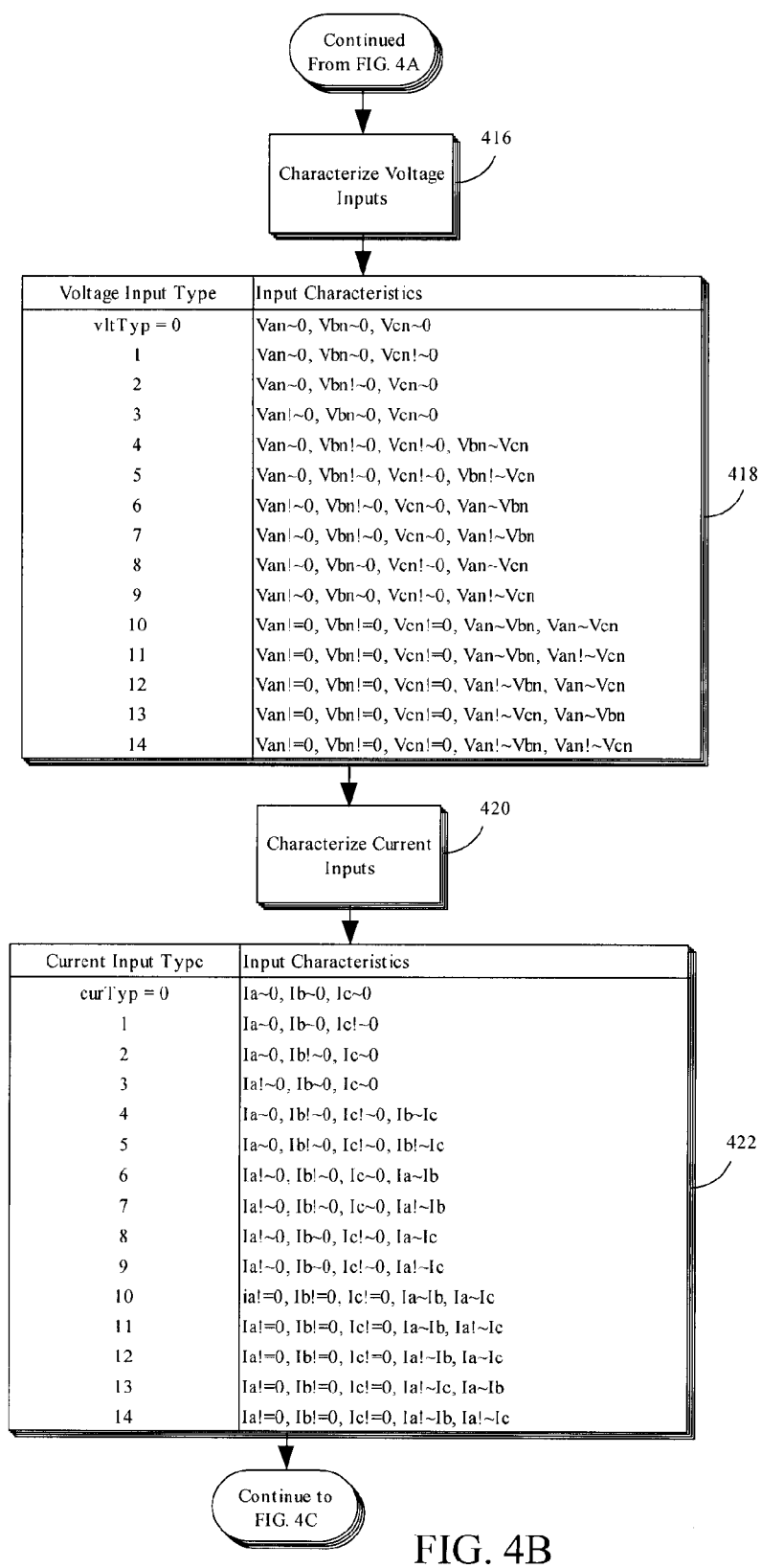
Figure 4C:
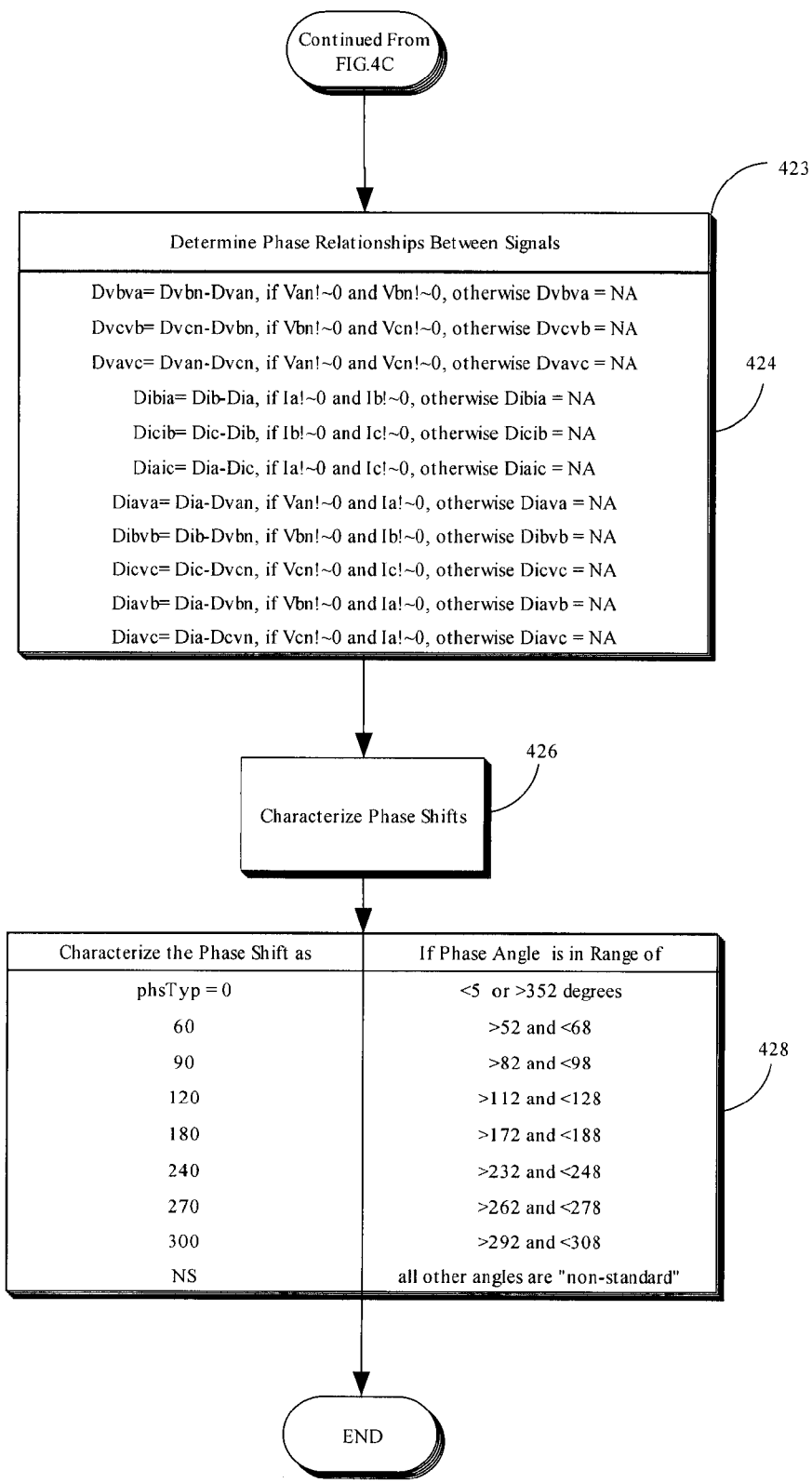

FIGS. 4A-4C is a flow diagram which illustrates a method for characterizing a set of measurements from a power system (general step 304 in FIG. 3) in accordance with one embodiment of the present invention. At step 402, the described process of the subsystem 110 determines which current sensors are present. Some sensors may be able to be identified. In such cases, it is beneficial to know that the measurement system 106 (see FIG. 1A) is not connected to the current sensors, as opposed to assuming that their output is zero. Without this knowledge, the chance for error in applying the rules can increase. At step 404, the subsystem 110 process determines the presence of any measurement signals from the power system 102 and the system under test 104. It is helpful to determine, symbolically, if the input is zero or not. A noise threshold for voltage might be set at, for example, 0.5 volts, and a threshold for current may also be selected. At step 406, the subsystem 110 process determines the magnitudes of the measured signals. Frequency is required for the identification of specific standard power systems.

At decision step 408, the process determines whether the measured signals point to a DC system (with respect to voltage or current), or not. If so, the process is directed to step 410 for an analysis for a DC system. If not, the process proceeds to step 412 where the fundamental phase angles (i.e., the phase angle of each signal's fundamental frequency relative to one reference signal, such as Van) are determined. The described process can still operate if a zero-detection algorithm is used, but that increases the chance of errors when applying knowledge base rules. At step 414, the process determines the amplitude equivalency of voltages and currents. As used herein, amplitude equivalency occurs when the magnitudes of two signals are substantially similar (for example, within a few percent of each other).

FIG. 4B continues the flow diagram of FIG. 4A. At steps 416 and 418, the actual voltage measurements are characterized to a smaller set of characteristic voltages and they are also compared to each other in order to determine the overall voltage arrangement, symbolically referred to as vltTyp, as illustrated in the decision box 418. These possible voltage arrangements and the characterized voltages are then applied to the knowledge bases and rules base to determine the type of power system and connection errors. At step 420 and 422 in the same as step 416 and 418, the actual current measurements are characterized and compared to each other in order to determine the overall current arrangement, symbolically referred to as curTyp, as illustrated in decision box 422.

FIG. 4C is a continuation of the flow diagram from FIG. 4B. At step 423, the phase relationships between all the signals are derived from the fundamental phase measurements as shown in the decision box 424. The symbol "NA" is applied to relationships that do not have a discernable measure due to the absence of one or more signals. At step 426, the phase relationships between each of the voltage signals and the phase relationships between each of the current signals are characterized by a set of symbolic relationships (Dxy=) as illustrated in database 428. These symbolic characterizations are exact replications of the ideal phase differences between signals of like kind (e.g., voltage) found in all power system types applied to the present embodiment. Phase relationships which cannot be characterized as one of the standards are characterized as "NS" for non-standard.

Figure 5A:
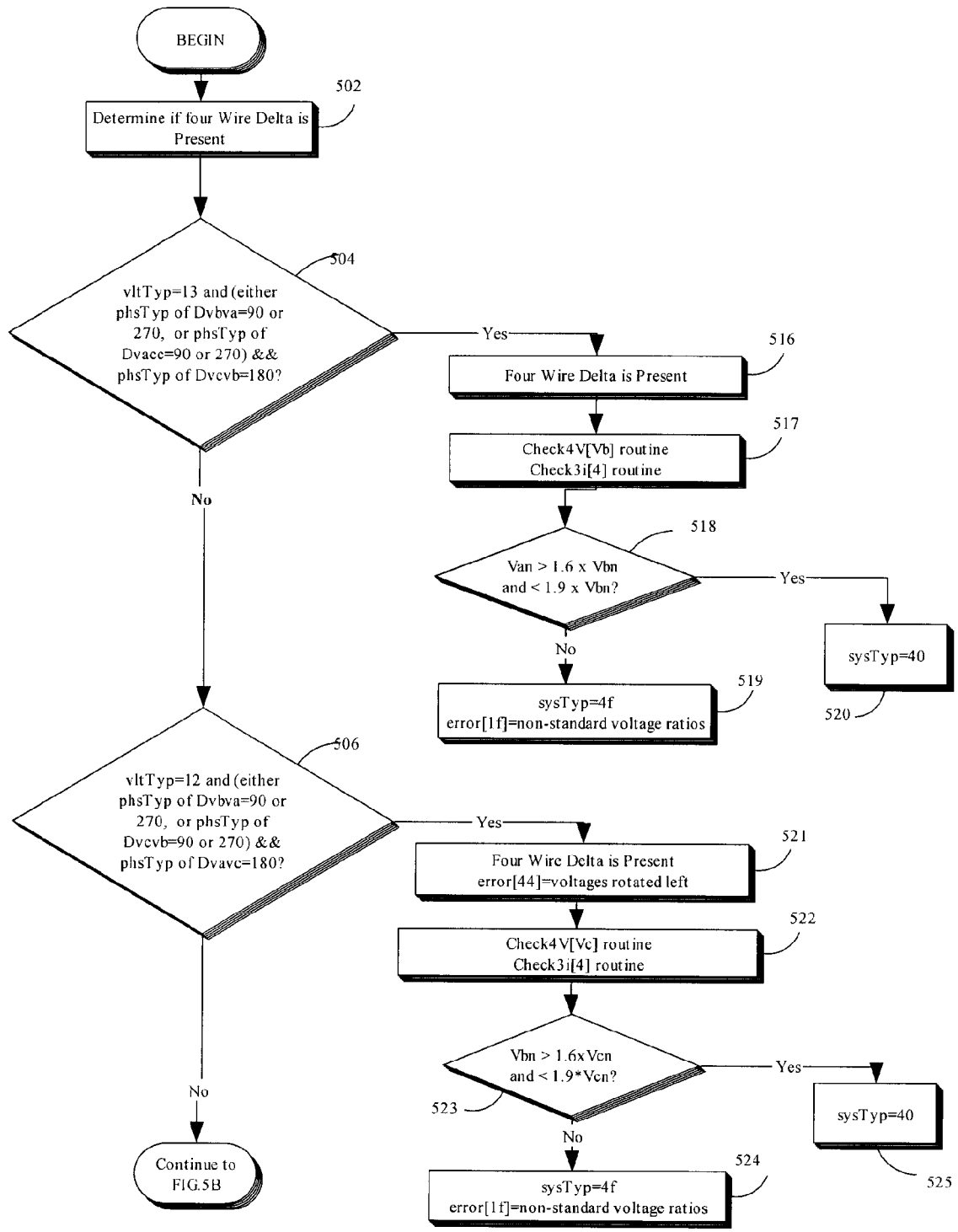
FIGS. 5A-5I illustrate a flow diagram of a method for identifying a phase system type in accordance with one embodiment of present invention.
Figure 5B:
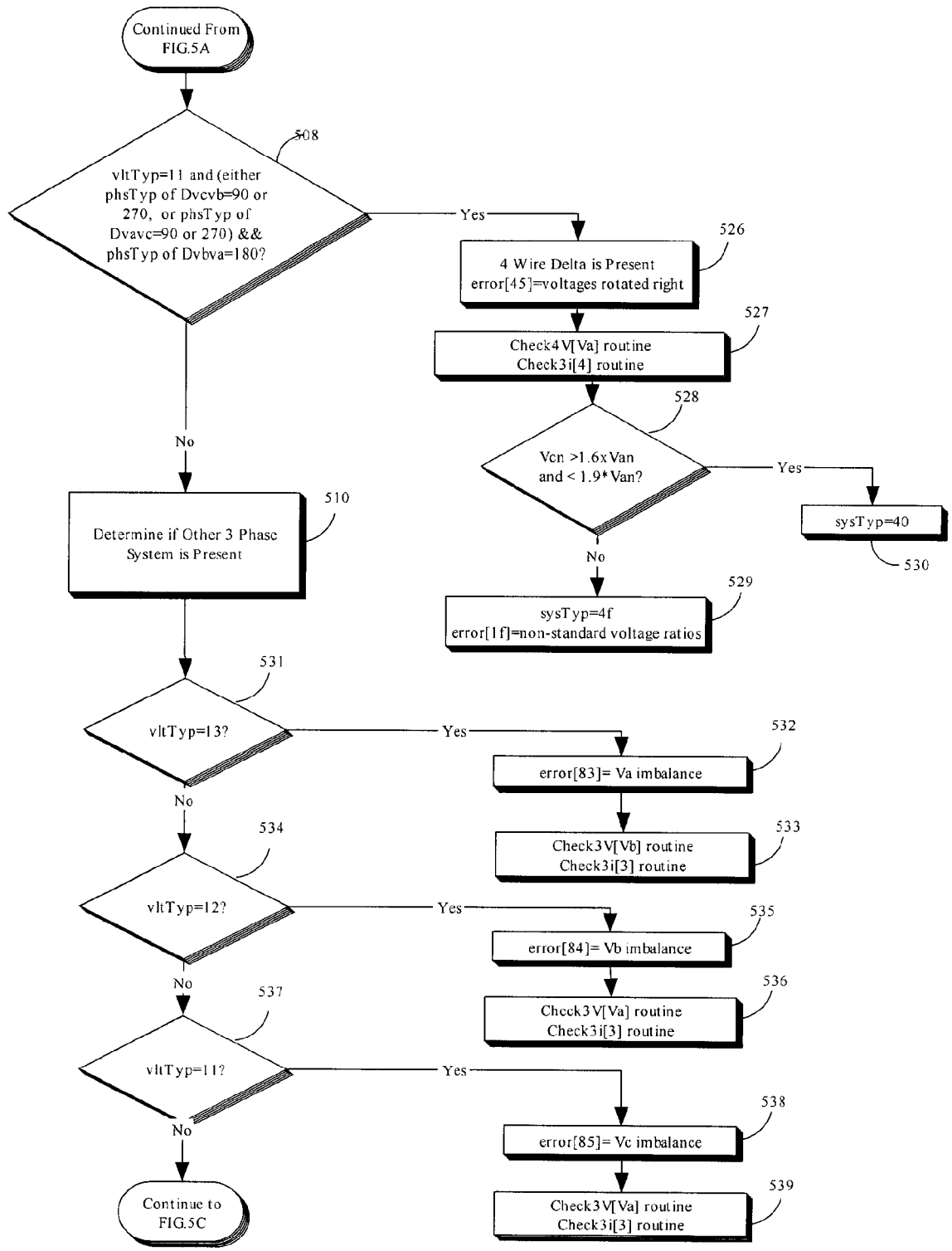
Figure 5C:
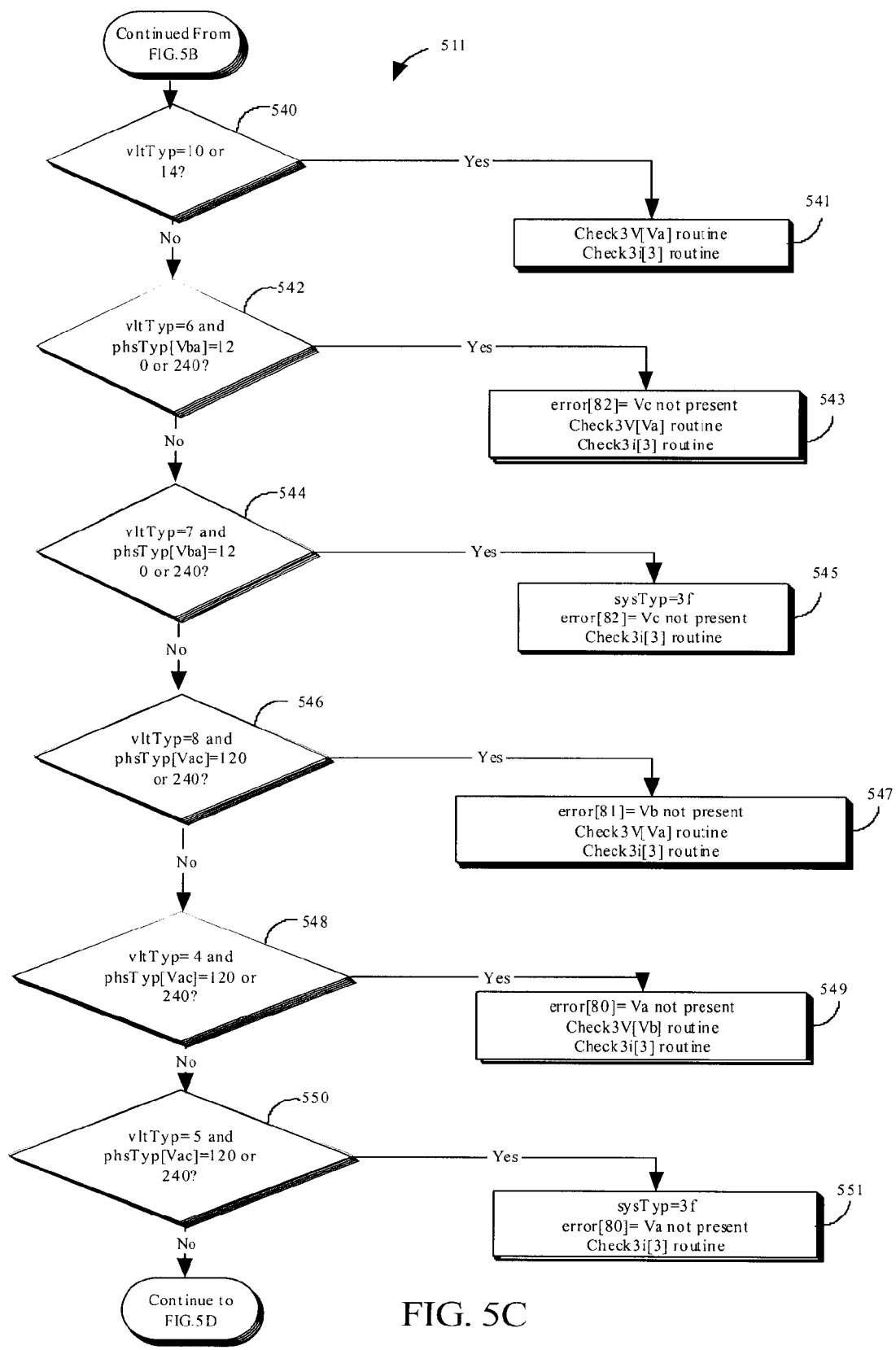
Figure 6:
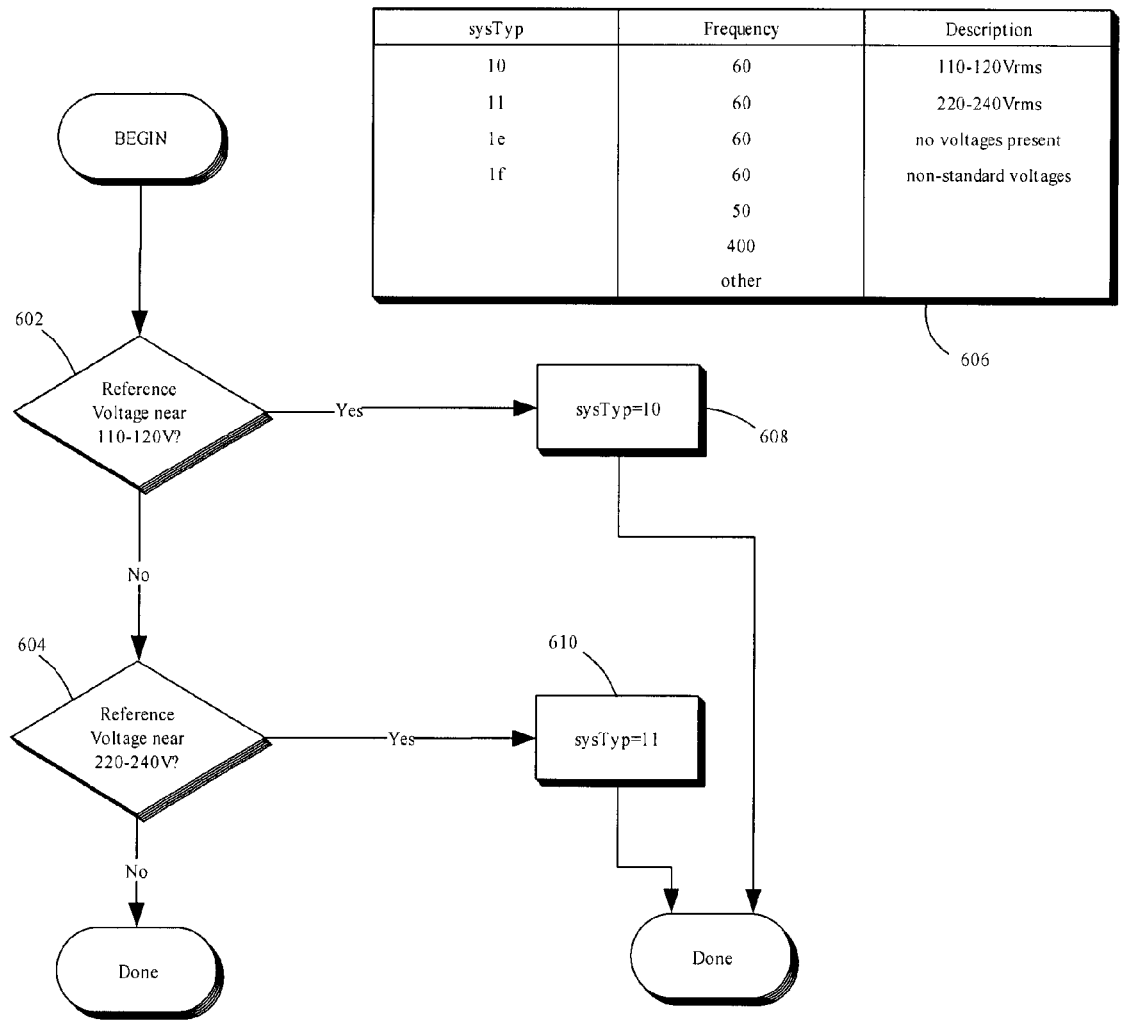
FIG. 6 illustrates a flow diagram of a method for identifying a single phase system type used in the FIGS. 5A-5I flow diagram as a subroutine, in accordance with one embodiment of the present invention.

FIGS. 5A-5C is a flow diagram of operations for identifying a power system, anomalies in the output of the system, and/or wiring and connection errors from a set of measurements and reporting out these results (general steps 306, 308 and 310 in FIG. 3) in accordance with one embodiment of the present invention. As described, a rule base systematically works through the characterized measurements with knowledge bases as described in the operations shown in FIGS. 4A-4C.

FIG. 5A starts the process with comment step 502 that a determination of whether a four-wire Delta system is present is to be made. Test steps 504 506 508, 518, 523 and 528, and steps 505, 517, 519-522, 524-530 make this determination.

Step 504 tests for the presence of a four-wire delta system by the distinctive phase and magnitude relationships between the voltages using the characterized measurements of FIGS. 4A-4C. If the step 504 determines the presence of a four-wire delta, then the process is directed to comment step 516 and operational step 517 which invokes two subroutines, Check4V[Vb] and Check3i[4]. Check4V is a subroutine that checks for voltage errors in a four-wire Delta system and Check3i is a subroutine that checks for current errors in a three-phase system. These subroutines are described in later flow diagrams. Besides the error determinations from the subroutines, other voltage and current errors are also detected throughout the described process. This is a matter of convenience. After step 517, test step 518 tests voltage relationships to reach the determination of one type of four-wire Delta system by step 520 or of another type of four-wire Delta system with errors by step 519.

Test steps 506 and 508 (in the flow chart in FIG. 5B) run further tests on the characterized information to determine if a four-wire Delta system is present in the absence of one or more signals or in the presence of one or more misconnections. The process applies the rules of analysis systematically. If step 506 determines the presence of a four-wire delta system, then the process moves to steps 521-525, which determines a certain error connection (step 521) and runs the Check4V[Vc] and Check3i[4] subroutines (step 522). After step 522, test step 523 tests voltage relationships to reach the determination of one type of four-wire Delta system by step 525 or of another type of four-wire Delta system with errors by step 524.

If step 508 on FIG. 5B determines the presence of a four-wire delta system, the process moves to steps 526-530, which operate in the same manner as described with respect to previously described steps 516-520 and 521-525.

Once the presence of a four-wire Delta system is ruled out, comment step 510 signals the easier task of identifying the presence of other three-phase systems even in the absence of one or more signals or the presence of one or more connection errors. Test step 531 (vltTyp=13?) and corresponding steps 532 and 533 with subroutines Check3V[Vb] and Check3i[3], test step 534 and corresponding steps 535 and 536 with subroutines Check3V[Vc] and Check3i[3], and test step 537 and corresponding steps 538 and 539 with subroutines Check3V[Va] and Check3i[3] systematically apply the symbolic measurements to the rule base to determine various errors.

In FIG. 5C, the process continues to test for more three-phase systems through steps 540-551. Step 540 and the even-numbered steps test for a particular assortment of voltages, i.e., vltTyp, and particular phase angle between selected voltages, i.e., phsTyp. Upon a positive test, the process moves to a corresponding one of the odd-numbered steps 541-551 to run subroutines, e.g., Check3V[Va] and Check3i[3] (Step 541), and/or a determination of a particular error, e.g., error [82]=Vc not present (Step 543), and/or a determination of a particular system type, e.g., sysTyp=3f (Step 545).

Figure 5D:
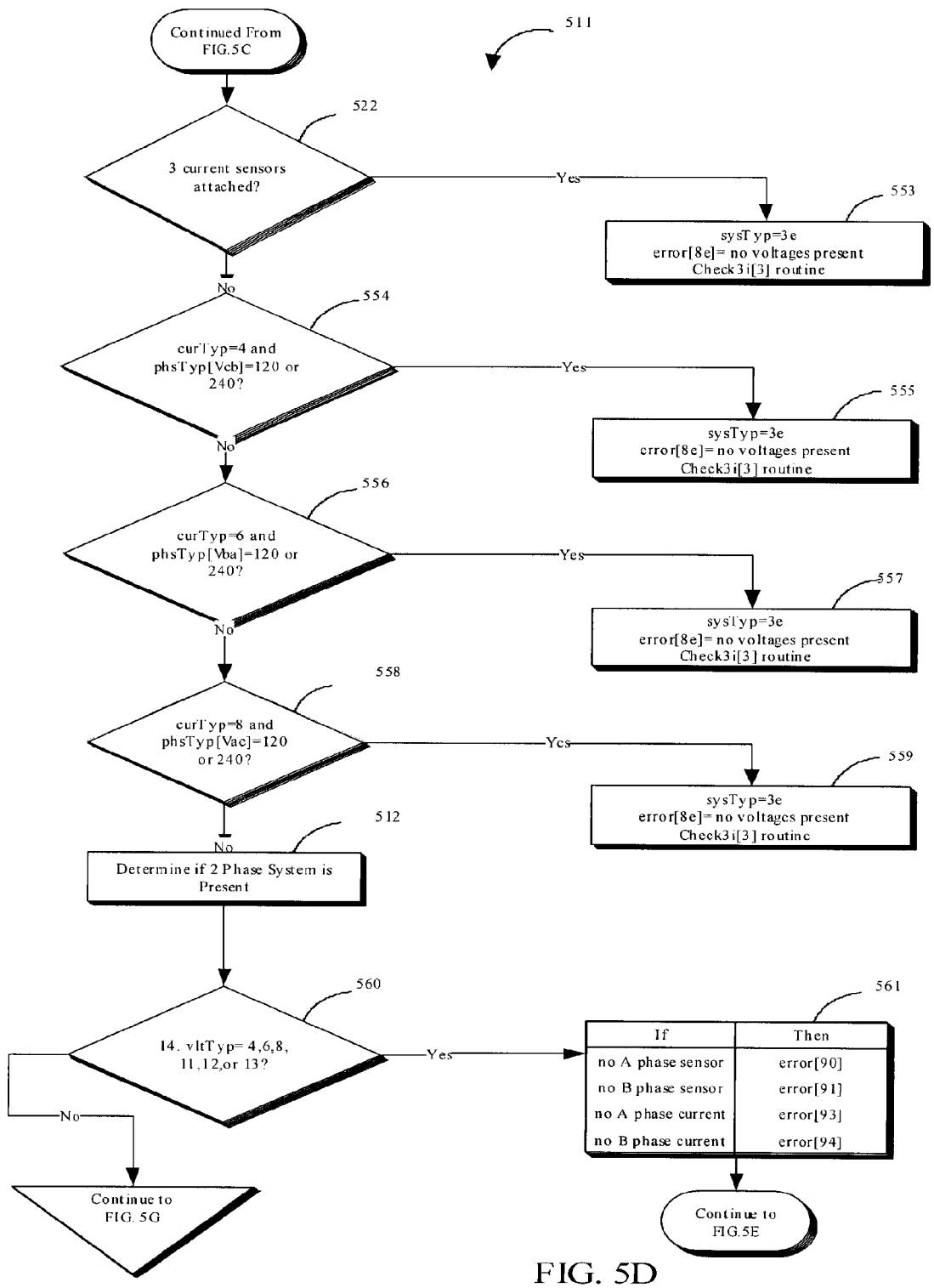
Figure 5E:
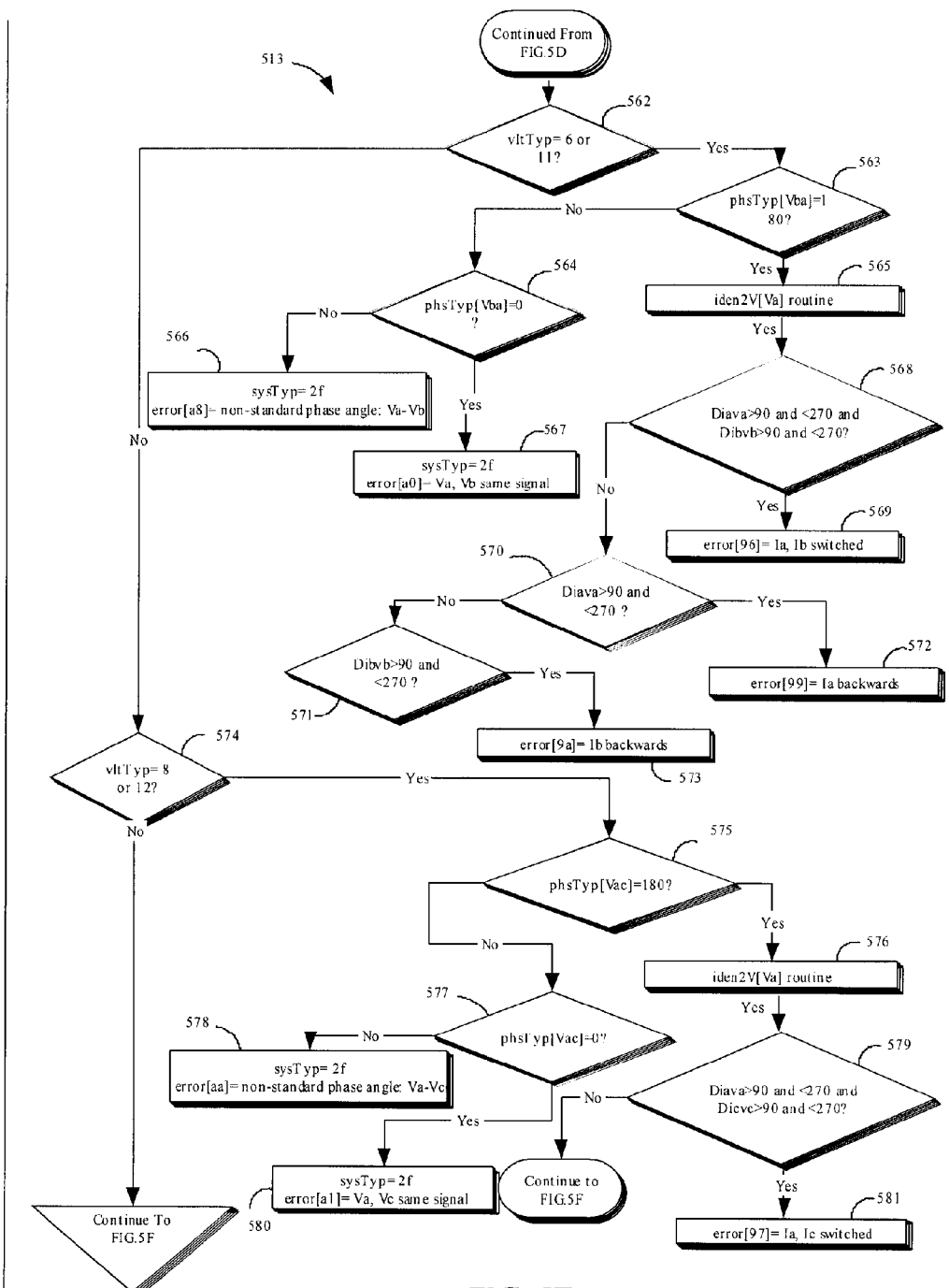

FIG. 5D continues the process flow from FIG. 5C. Now the assortment of currents is checked to determine a three-phase system. Step 522 tests whether three current sensors are attached. If so, the process moves to step 553 where a power system type is determined (sysTyp=3e), an error is determined (error[8e]=no voltage present) and the Check3i[3] subroutine is run. If not, the process moves to even-numbered steps 554-558 which test for a particular assortment of currents, i.e., curTyp, and particular phase angle between selected voltages, i.e., phsTyp. Upon a positive test, the process moves to a corresponding one of the odd-numbered steps 555-559 which all run the subroutine Check3i[3], determine the occurrence of a particular error, error[8e]=no voltage present (Step 543), and determine a particular system type, i.e., sysTyp=3e.

If the process passes through these steps 554-558 and the presence of any three-phase system has been ruled out, the process proceeds to a still easier task, the identification of the presence of a two-phase system, as indicated by comment step 512. For instance, a four-wire Delta system with Van missing appears like a two-phase system when observing the voltage, but the symbolic current phase relationships can reveal that it is actually a four-wire Delta with a wiring error.

At this point, test step 560 inquires whether certain voltage assortments are present (vltTyp=4, 6, 8, 11, 12 or 13?). If not, the process moves to step 514 in FIG. 5G. If so, then step 561 runs further conditional tests to determine different errors. The process proceeds to determine which voltages are present. Step 562 tests whether the voltage assortment represented by vltTyp=6 or 11, is present. If so, step 563 tests whether the phase angle between Va and Vb is 180 (phsTyp [Vba]=180?). If yes, step 565 runs a two-phase system subroutine Iden2V[Va] which determines errors in two-phase systems. Then step 568 tests whether the system has a phase angle between 90 and 270 between the signals ia and Va, and a phase angle between 90 and 270 for the signals ib and Vb (Diava>90 and <170 and Dibvb>90 and <270?). If positive, step 569 represents the determination of a particular error. If negative, steps 570-773 run further phase angle tests for selected signals (steps 570 and 571) to make error determinations (steps 572 and 573.)

If the test of step 562 is negative, step 574 tests whether the voltage assortment represented by vltTyp=8 or 12, is present. If positive, then steps 575-584 and 586 (steps 582-584 and 586 in FIG. 5F) operate in the same manner as the steps 563-573 with respect to step 562 to make determinations of system type and the existence of errors. If negative, step 585 tests whether the voltage assortment represented by vltTyp=4 or 13, is present. If that test is positive, then steps 587-597 operate in the same manner as the steps 563-573 with respect to step 562 to make determinations of system type and the existence of errors. If the test of step 585 is negative, the process proceeds to step 598 to test for the voltage assortment represented by vltTyp=0 and 2 with currents sensors attached. The test at this point should be positive and the determination is made sysTyp=2e in step 599 on FIG. 5F.

Figure 5F:
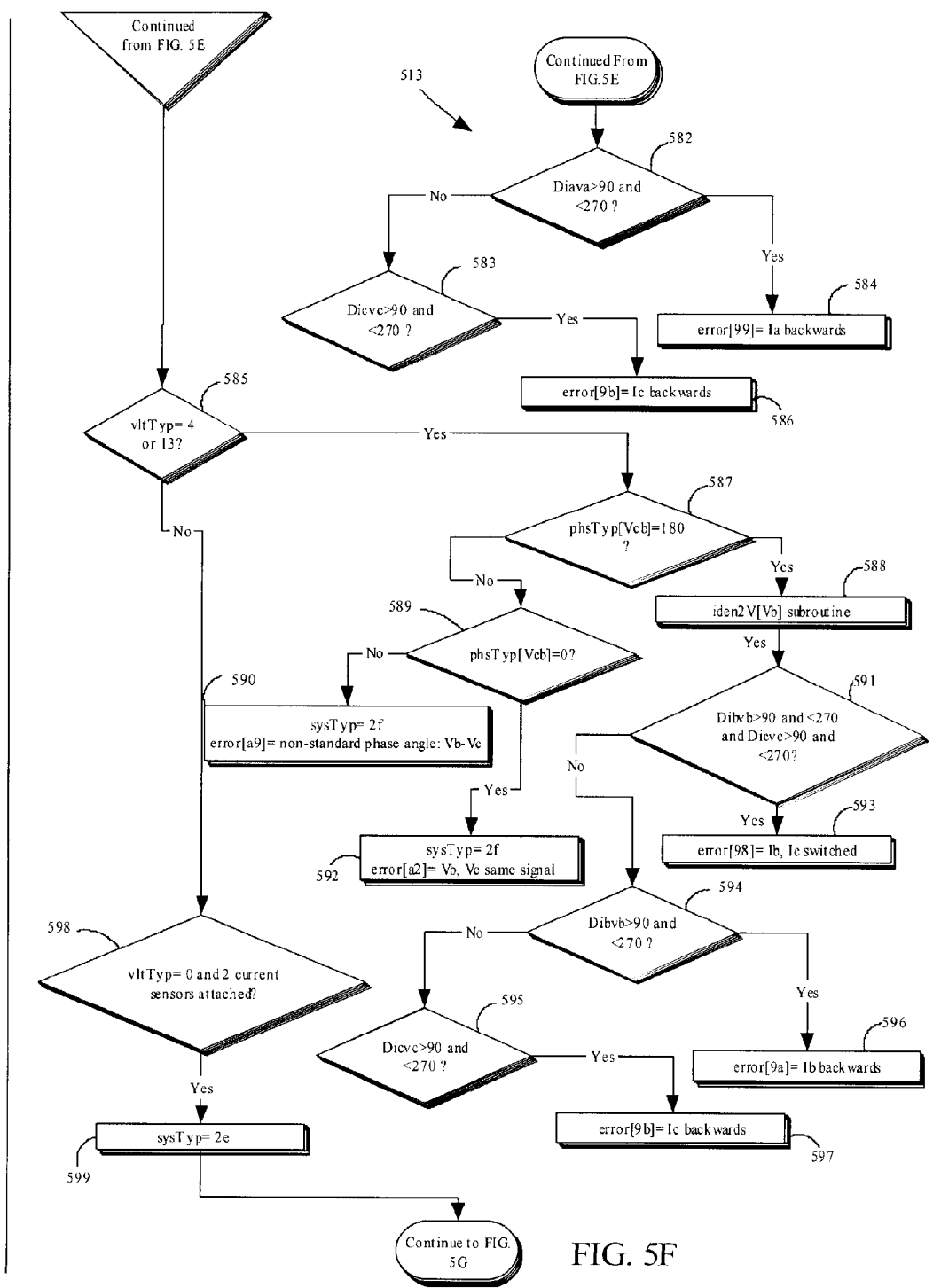

Continuing from step 599 in FIG. 5F, the process continues to step 1001 where a series of error determinations are made. Following step 1002 tests whether the phase angle between the two currents Ia and Ib is zero. The answer should be positive and the process in step 1003 then tests for a particular current assortment (curTyp=6?) If the test is positive, a particular error is determined in step 1005. If the test is negative, then step 1004 test for another particular current arrangement (curTyp=7?) which should invoke a positive response and another particular error is determined in step 1006. This is the end of the two-phase system identification steps.

Figure 5G:
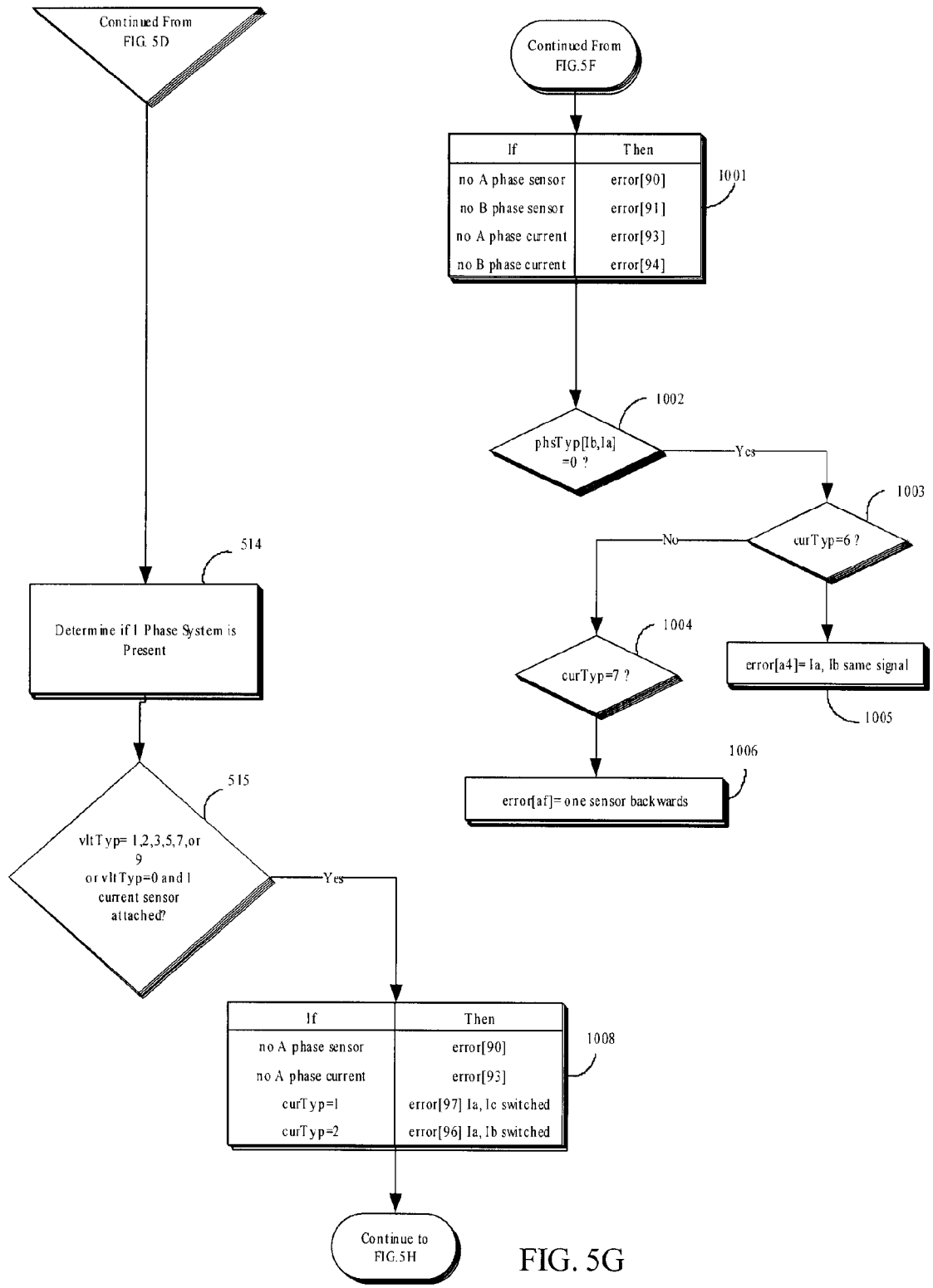

Step 514 on FIG. 5G is a continuation of the process from a negative response to the test step 560 on FIG. 5D and a negative determination of the presence of any two or three-phase system. The comment step 514 starts the identification of the presence of a one-phase system. For example, it should be pointed out that if only one voltage is available, but two currents are also available and they had the symbolic measurements coinciding with a three-phase system, the present method would have already considered the measured system as a three-phase system. Of course, in accordance with the present invention, determinations could be performed in reverse order from the presently described method, i.e., single-phase systems could be evaluated first, then two-phase and so forth, up to a four-wire Delta system.

Returning to FIG. 5G, test step 515 tests for the existence of certain voltage combinations (vltTyp=1, 2, 3, 5, 7 or 9?) or for a particular voltage combination (vltTyp=0) and the attachment of one current sensor. The response should be positive and the process moves to test step 1008 by which tests are made to determine particular errors, e.g., if a certain combination is present (curTyp=1), then currents Ia and Ic are switched (error[97]). The process then continues to step 1009 on FIG. 5H which tests for a particular voltage combination (vltTyp=7?). If the response is positive, test steps 1052, 1021 and 1022 test for a certain voltage relationship (step 1052) or for certain phase relationships (steps 1021 and 1022). From these tests, error determinations are made by steps 1020, 1023 and 1024. If the response to step 1009 is negative, another voltage combination test is made by step 1010. If the response to step 1010 is positive, test steps 1011, 014 and 1015 test for a certain voltage relationship (step 1011) or for certain phase relationships (steps 1014 and 1015). From these tests, error determinations are made by steps 1012, 1013, 1017 and 1018.

Negative responses to the test steps 1014 and 1015 and after error determination steps 1012 and 1013, the process moves to one-phase system identification subroutines for different voltages. Subroutine Iden1V[Va] follows steps 1014 and 1017 and Subroutine Iden1V[Vc] follows steps 1015 and 1018. These subroutines are described in detail below with respect to FIG. 6.

A negative response to step 1010 moves the process to test step 1025 which tests for a particular voltage combination (vltTyp=5?). The steps following step 1025 are all on FIG. 5I. If the response to test step 1025 is positive, the process moves to test step 1028 which tests whether the magnitude of one voltage is greater than another (Vbn>Vcn?).

If yes, step 1030 determines certain errors and the process moves to another test step 1034 for whether the phase angle between two signals, Ia and Vbn, is between 90 and 270 degrees. If the response to step 1034 is positive, step 1038 determines a particular error and the process moves the one-phase system identification subroutine Iden1V[Vb] in step 1039. If the response to step 1034 is negative, the process moves directly to the step 1039 and its one-phase system identification subroutine. If the response to the test step 1028 is no, step 1029 makes an error determination and the process moves to test step 1033 which tests whether the phase angle between two signals, Ia and Vcn, is between 90 and 270 degrees. An affirmative response leads to error determination step 1035 and then to the one-phase system identification subroutine Iden1V[Va] in step 1036. A negative response leads directly to step 1036.

Figure 5H:
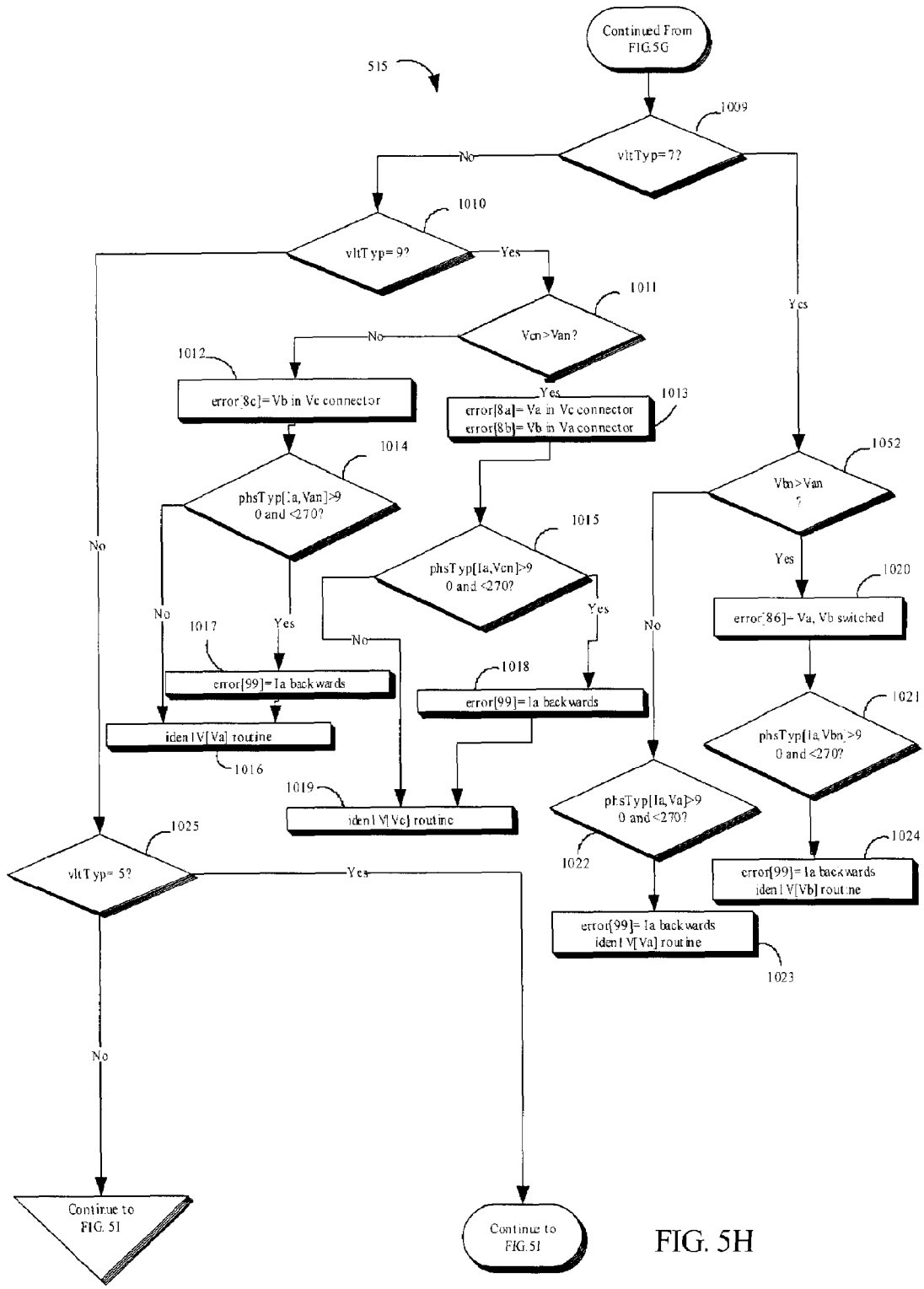
Figure 5I:
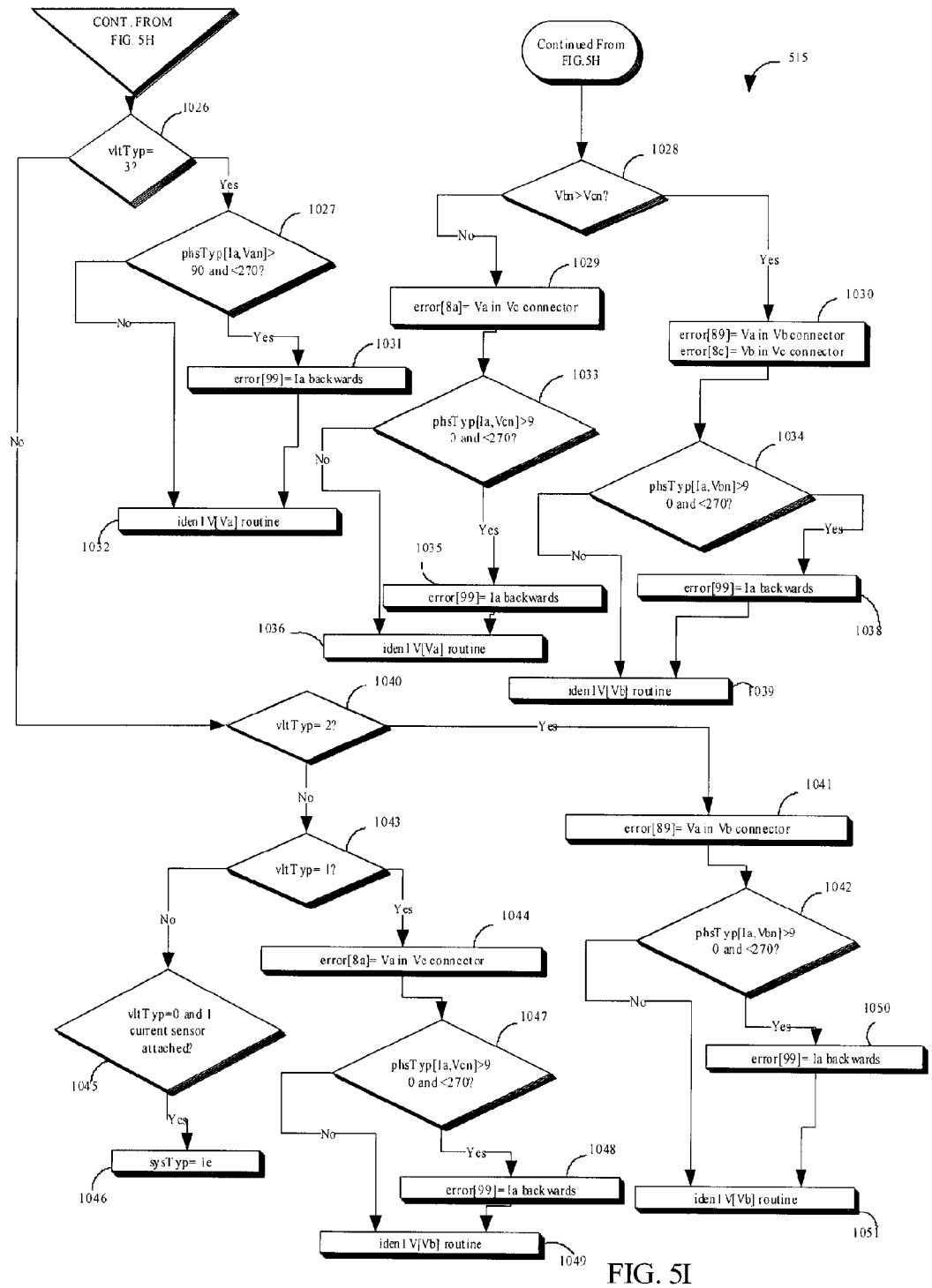

If the response to test step 1025 on FIG. 5H is negative, the process moves to test step 1026 on FIG. 5I which tests for particular voltage combination (vltTyp=3?). If the response is positive, then the process moves to test step 1027 for whether the phase angle between two signals, Ia and Van, is between 90 and 270 degrees. If the response to step 1027 is positive, step 1031 determines a particular error and the process moves the one-phase system identification subroutine Iden1V[Va] in step 1032. If the response to step 1027 is negative, the process moves directly to the step 1032 and its one-phase system identification subroutine.

If the response to test step 1026 is positive, then the process moves to test step 1040 to test for another voltage combination (vltTyp=2?). If the response to test step 1040 is positive, step 1041 determines a particular error and the process move to test step 1042 for whether the phase angle between two signals, Ia and Vbn, is between 90 and 270 degrees. In the same manner as described above with respect to test steps 1027, 1033 and 1034, steps 1050 and 1051 determine an error and run a one-phase system identification subroutine, Iden1V [Vb]. If the response to test step 1040 is negative, the process move to test step 1043 for voltage combination (vltTyp=1?). If the response is positive, step 1044 makes a particular error determination and the process moves to test step 1047 which tests whether the phase angle between two signals, Ia and Vcn, is between 90 and 270 degrees. Again, in the manner as described above with respect to test steps 1027, 1033, 1034 and 1042, steps 1048 and 1049 determine an error and run the one-phase system identification subroutine, Iden1V[Vb]. If the response to test step 1043 is negative, test step 1045 tests whether the voltage combination for vltTyp=0? and whether one current sensor is attached. The response should be positive and system is determined (sysTyp=1e) by step 1046.

Hence the operations following the flow chart on FIGS. 5A-5I lead to an identification of the power system and the errors in the connection and wiring of the system.

FIG. 6 is a flow diagram which illustrates a method for identifying a single-phase system type and in particular, FIG. 6 illustrates an embodiment of the Iden1V subroutine. At test steps 602 and 604, voltage measurements are combined with the symbolic frequency measurement for comparison to a power systems knowledge base represented by an exemplary table 606 in order to determine which power system is present (steps 608 and 610) on all frequency systems. The table 606 is an example of the knowledge base; only a few standard systems of the power systems knowledge base are illustrated. Not all of the power system types are found by the identification subroutines. Some identification is made in the operation of the process charted by FIGS. 5A-5I. As shown on FIG. 5I, sysTyp 1e is identified by step 1046.

The actual measurements are compared to the ideal characterizations within some percentage amount. A range of ±10% is reasonable, though other ranges could be used.

Furthermore, it should be noticed that neutral current is not used in the subroutine because this embodiment of the present invention does not require differentiation of a three-phase Wye system from a three-phase Delta system. If a Wye system were differentiated from a Delta system, the neutral current magnitude, neutral current frequency, and voltage magnitude would be sensed and evaluated in the same manner as shown in the flow diagrams. Neutral current in a Wye system tends to be dominated by the third harmonic of the fundamental frequency. If the fundamental harmonic predominates, then there may either be a connection problem or a wiring problem or a defective load. Examination of the phase and magnitude of such a neutral current indicate whether a connection problem, a wiring problem, or a load problem is likely. Combining this with the voltage magnitude allows prediction of which standard or non-standard Wye system or Delta system is connected.

Figure 7:
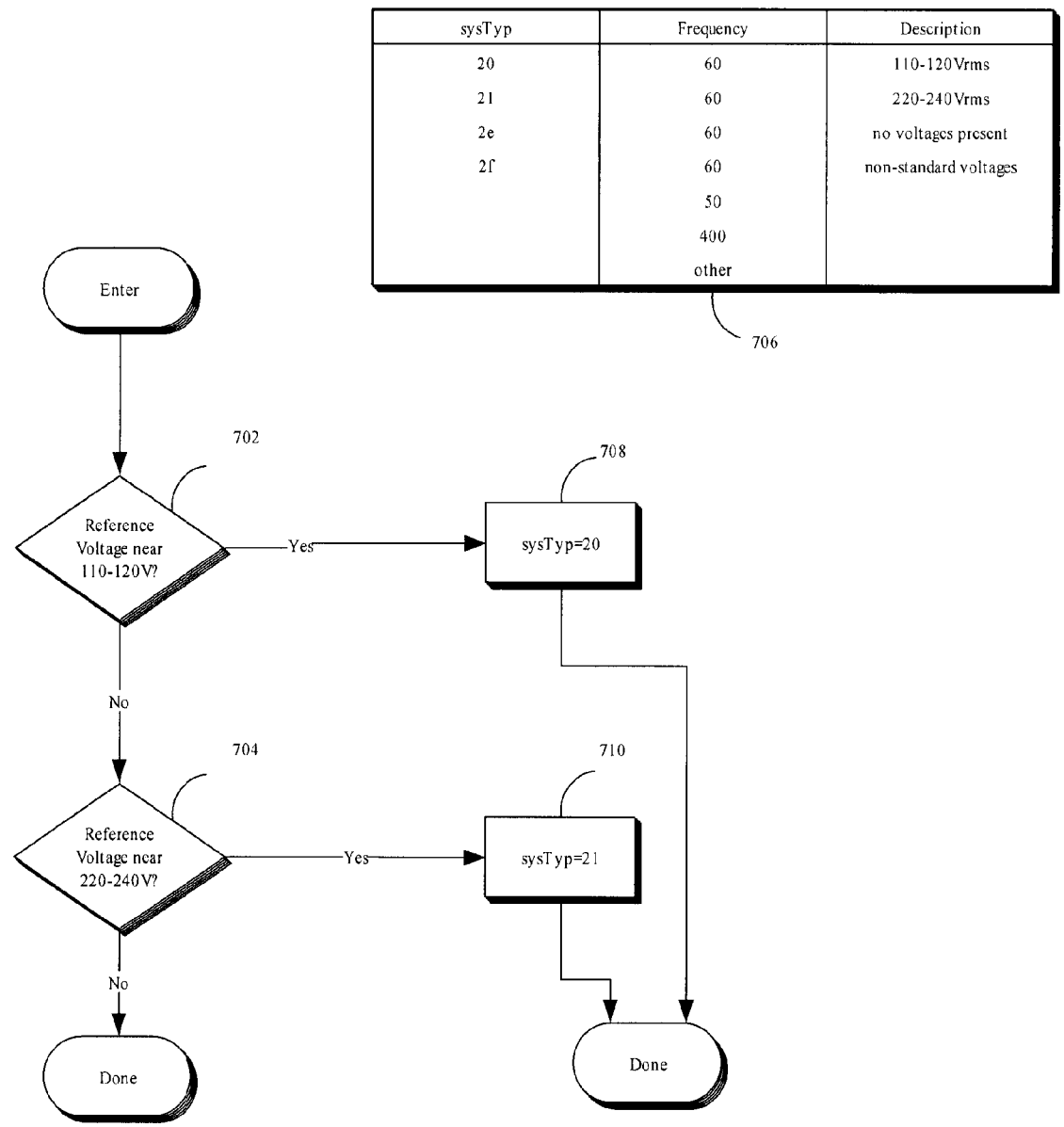
FIG. 7 illustrates a flow diagram of a method for identifying a two-phase system type used in the FIGS. 5A-5I flow diagram in accordance with one embodiment of the present invention.

FIG. 7 is a flow diagram which illustrates a method for identifying a two-phase system type for all frequency systems and in particular, FIG. 7 illustrates an embodiment of the Iden2V subroutine. At steps 702 and 704, voltage measurements are combined with the symbolic frequency measurement for comparison to a power systems knowledge base represented by an exemplary table 706 in order to determine which power system is present (steps 708 and 710). The table 706 is an example of the knowledge base; only a few standard systems of the power systems knowledge base are illustrated. As stated above, not all of the power system types are found by the identification subroutines; some identification is made in the operation of the process charted by FIGS. 5A-5I. For two-phase systems, e.g., sysTyp 2e is identified by step 599 on FIG. 5F; sysTyp 2f is identified by steps 566, 567, 578 and 580 on FIG. 5E and steps 590 and 592 on FIG. 5F. And, as in the case of the flow diagram of FIG. 6, actual measurements must be compared to the ideal characterizations within some percentage amount.

Figure 8A:
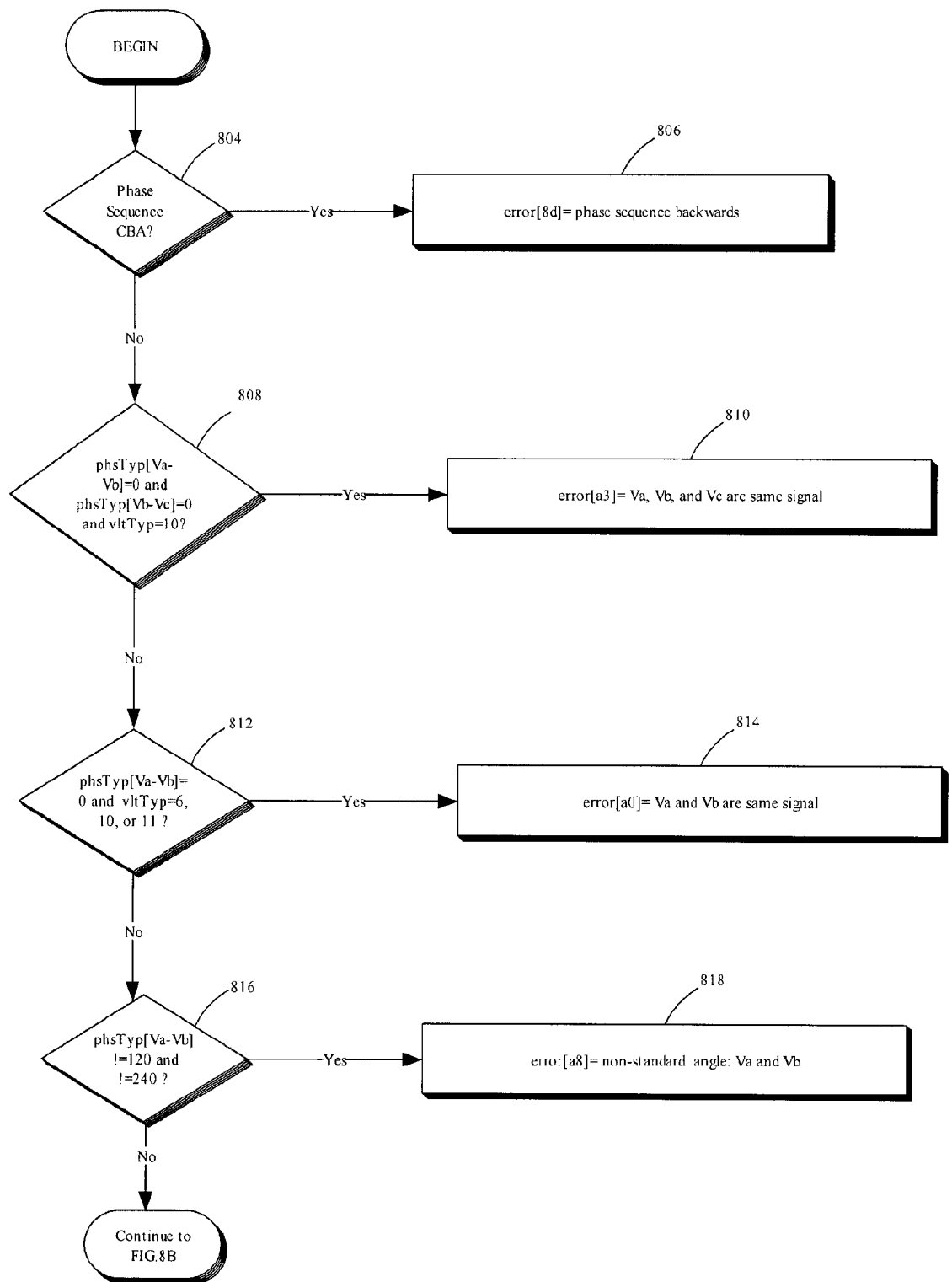
FIGS. 8A-8C illustrate a flow diagram of a method for identifying a three-phase system type used in the FIGS. 5A-5I flow diagram in accordance with one embodiment of the present invention.
Figure 8B:
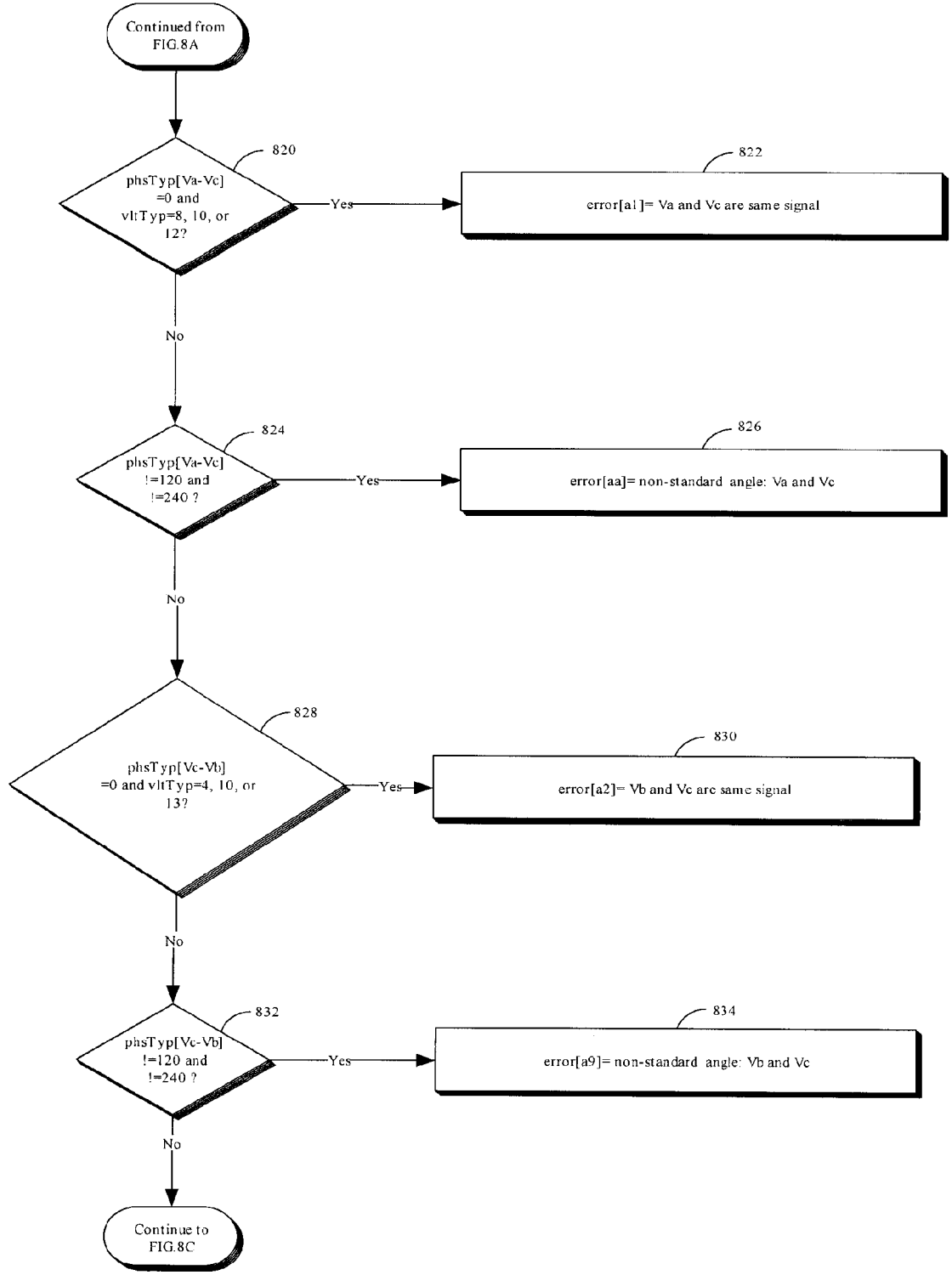
Figure 8C:
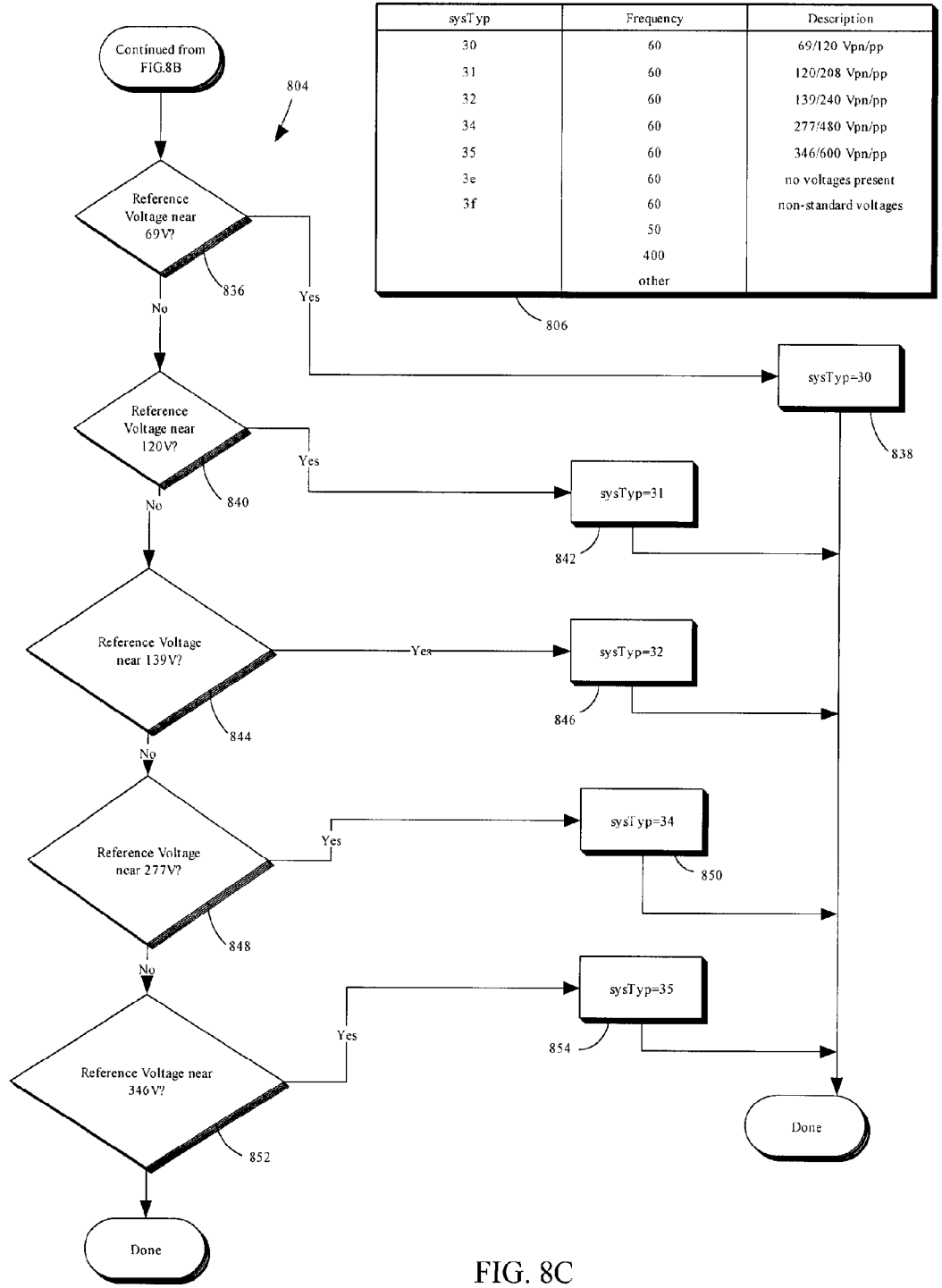

FIGS. 8A-8C are flow charts which illustrates a method for identifying a three-phase system type for all frequency systems and in particular, FIGS. 8A-8C illustrate an embodiment of the Iden3V subroutine. The subroutine operates in the same manner as the Iden1V and Iden2V subroutines above. Steps 804, 808, 812, 816, 820, 824, 828 and 828 perform a sequence of phase relationship and voltage combination tests. If the response to a particular test step is positive, then an error determination is made by a corresponding step 806, 810, 814, 818, 822, 826, 830 and 832. For example, beginning test step 804 tests whether the phase sequence is in the order of C-B-A. If the test is positive, step 806 determines an error, error[8d]=phase sequence backwards. After the phase relationship and voltage combination tests, steps 836, 840, 844, 848, and 852 combine a sequence of reference voltage tests with the symbolic frequency measurement for comparison to a power systems knowledge base represented by an exemplary table 806 in order to determine which power system is present (steps 838, 842, 846, 850 and 854). The table 806 is an example of the knowledge base, but only a few standard systems of the power systems knowledge base are illustrated. But some identification is made in the operation of the process charted by FIGS. 5A-5I. SysTyp 3e is identified by steps 553, 555, 557 and 559 on FIG. 5D; sysTyp 3f is identified by steps 545 and 551 on FIG. 5C.

FIGS. 9A-9J are flow charts which illustrate a method for evaluating current sensor connections in a three-phase system type and in particular, these flow charts illustrate an embodiment of the Check3i subroutine. At the beginning of most analyses of a three-phase system with less than three currents is the determination of which currents are connected and which are considered zero. Step 902 performs this evaluation.

The process then moves to test step 926 which begins the process of determining current connection problems by comparing the voltage/current phase lag from phase to phase. If non-zero signals are present, the phase lag of A phase is subtracted from the phase lag of B phase, the phase lag of B phase is subtracted from the phase lag of C phase, and the phase lag of C phase is subtracted from the phase lag of A phase. These comparative numbers, phsDif, form the basis of most of the artificial intelligence rule base that follows. A sequence of test steps 926, 929 and 931, operational steps 927, 930 and 933 which perform the phase lag subtraction (e.g., phsDif=phsAng[B phase lag]–phsAng[A phase lag] (step 927)), and phase angle determination steps 925, 928 and 932 (phsDif=NA) carry out this operation.

Figure 9A:
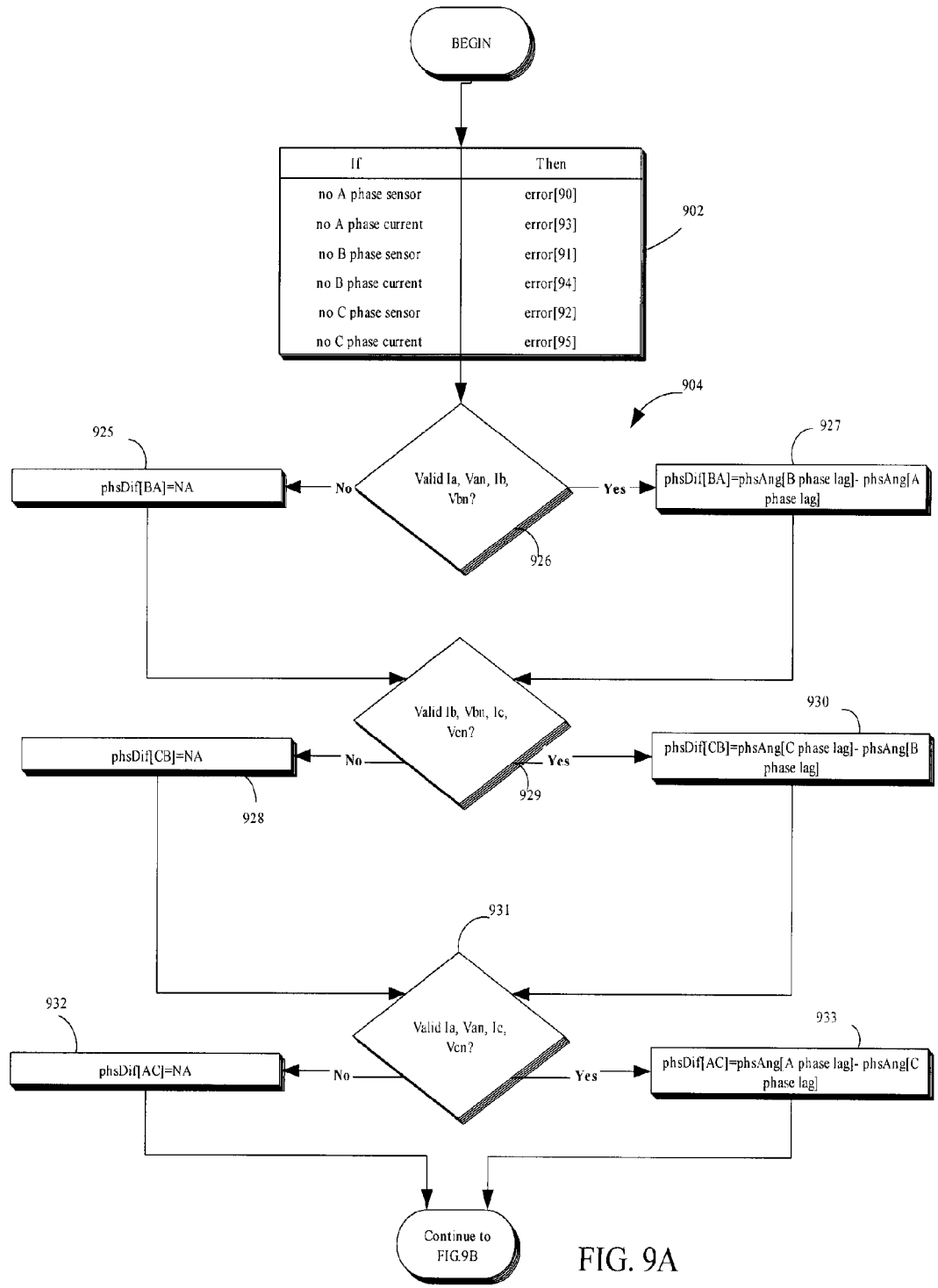
FIGS. 9A-9J illustrate a flow diagram of a method for evaluating current sensor connections in a three-phase system type used in the FIGS. 5A-5I flow diagram in accordance with one embodiment of the present invention.
Figure 9B:
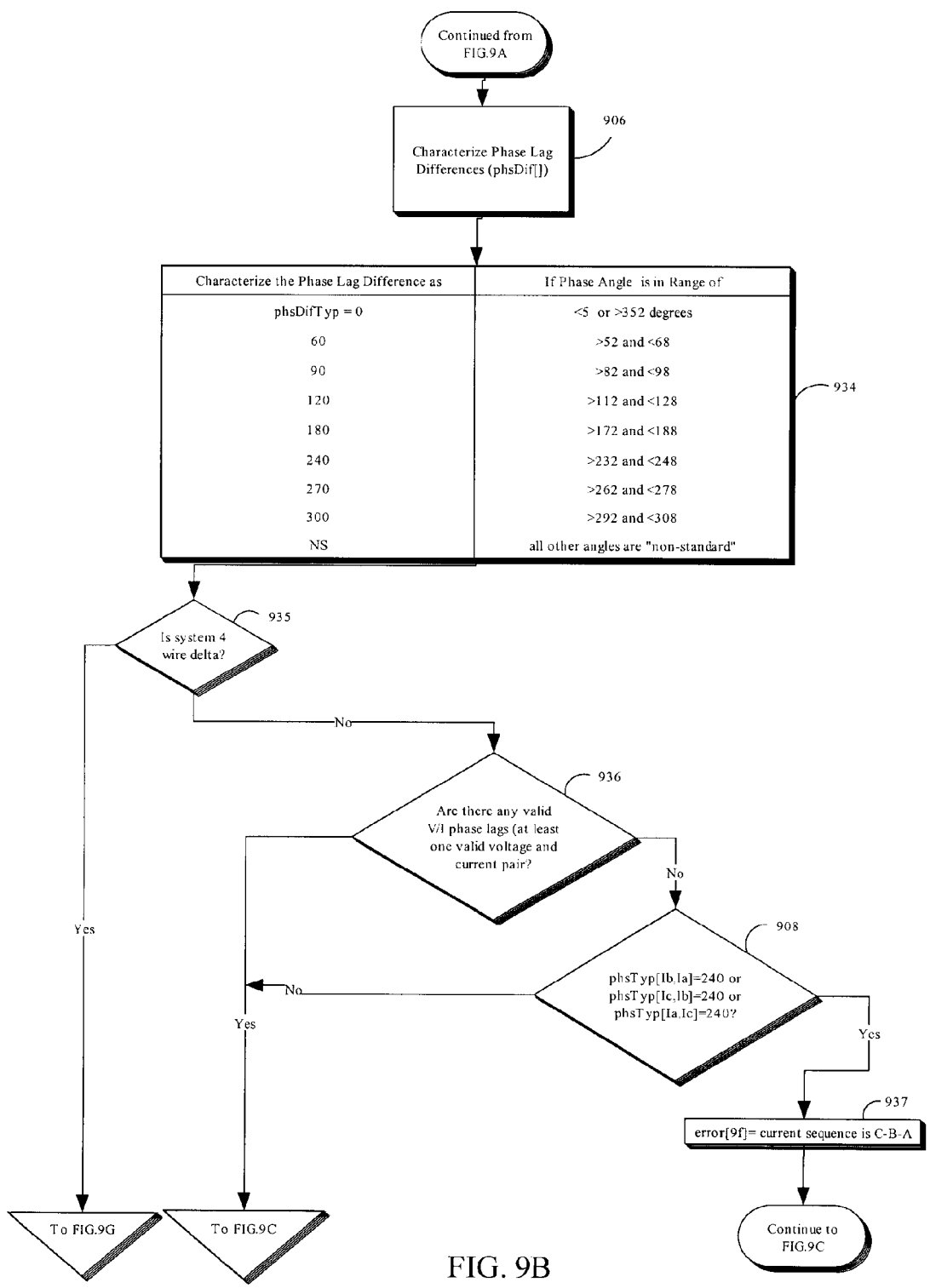

Comment step 906 on FIG. 9B indicates the process of characterizing of the phase lag differences, phsDif. In step 934 the phase lag differences previously discussed are then evaluated into symbolic characterized measurements that coincide with all standard phase lag differences to be expected in a three-phase system for any combination of current connection errors. Step 935 then tests whether the system is a 4-wire Delta system and if not, the process moves to step 936 which tests for any valid phase lags for a voltage and current pair. A positive response to step 935 moves the process to FIG. 9G for 4-wire Delta analysis. A positive response to step 936 moves the process to FIG. 9C and a negative response to test step 936 moves the process to test step 908 where a C-B-A sequence is checked for. A positive response to step 908 leads to step 937 which determines an error. It should be noted that a system with a C-B-A sequence could be designed and the present invention easily adapted to accept this sequence as the standard.

Figure 9C:
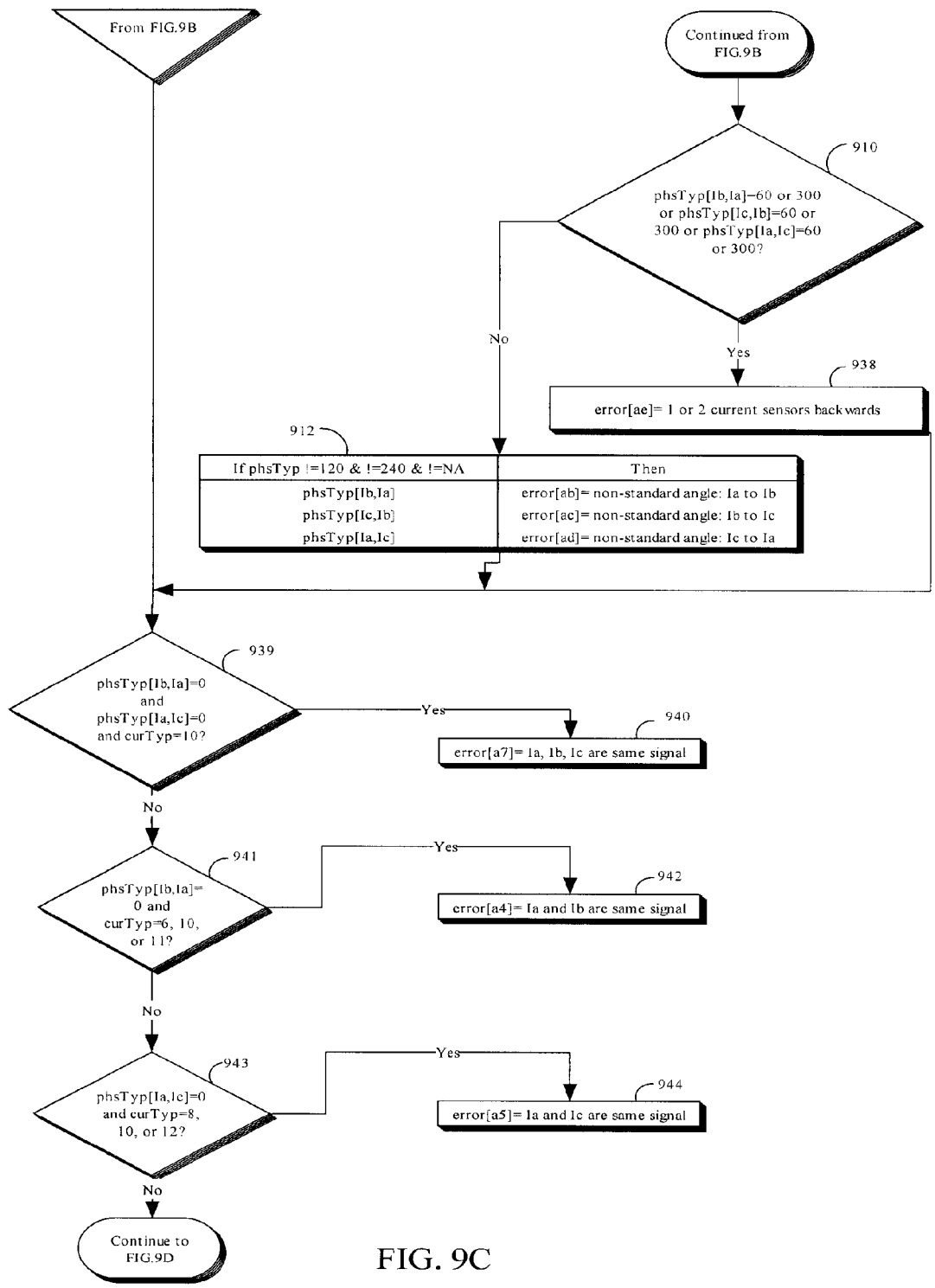
Figure 9D:
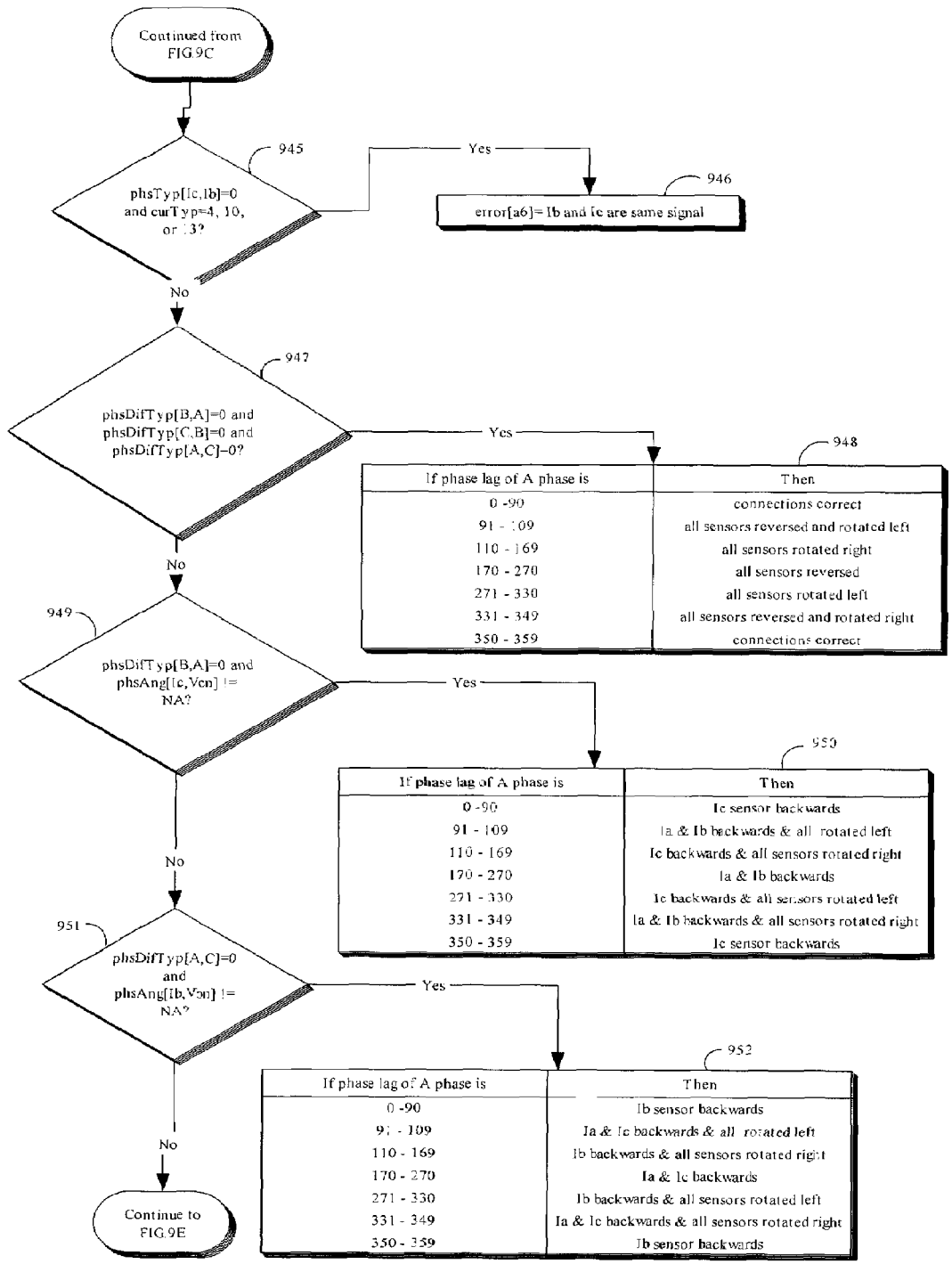
Figure 9E:
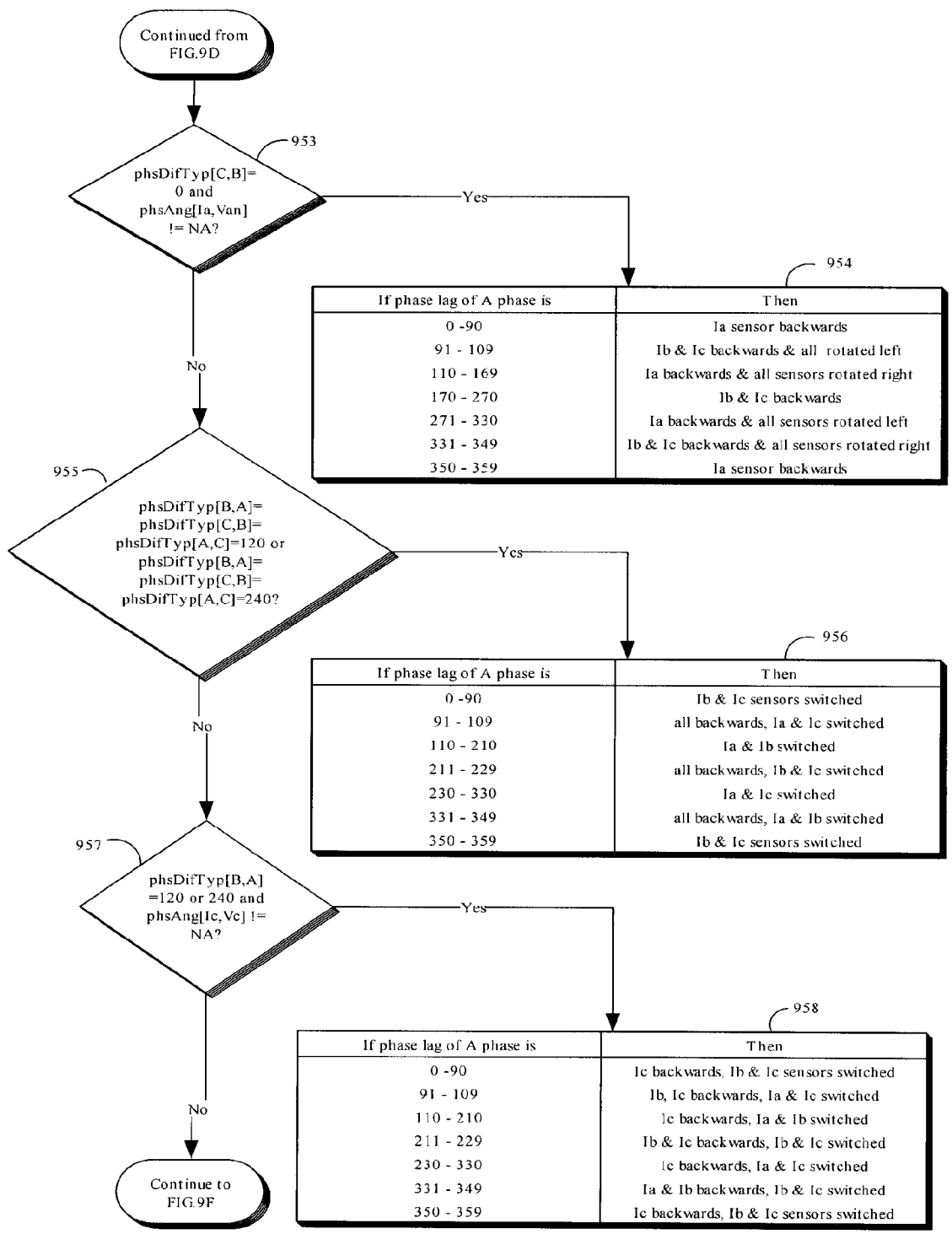
Figure 9F:
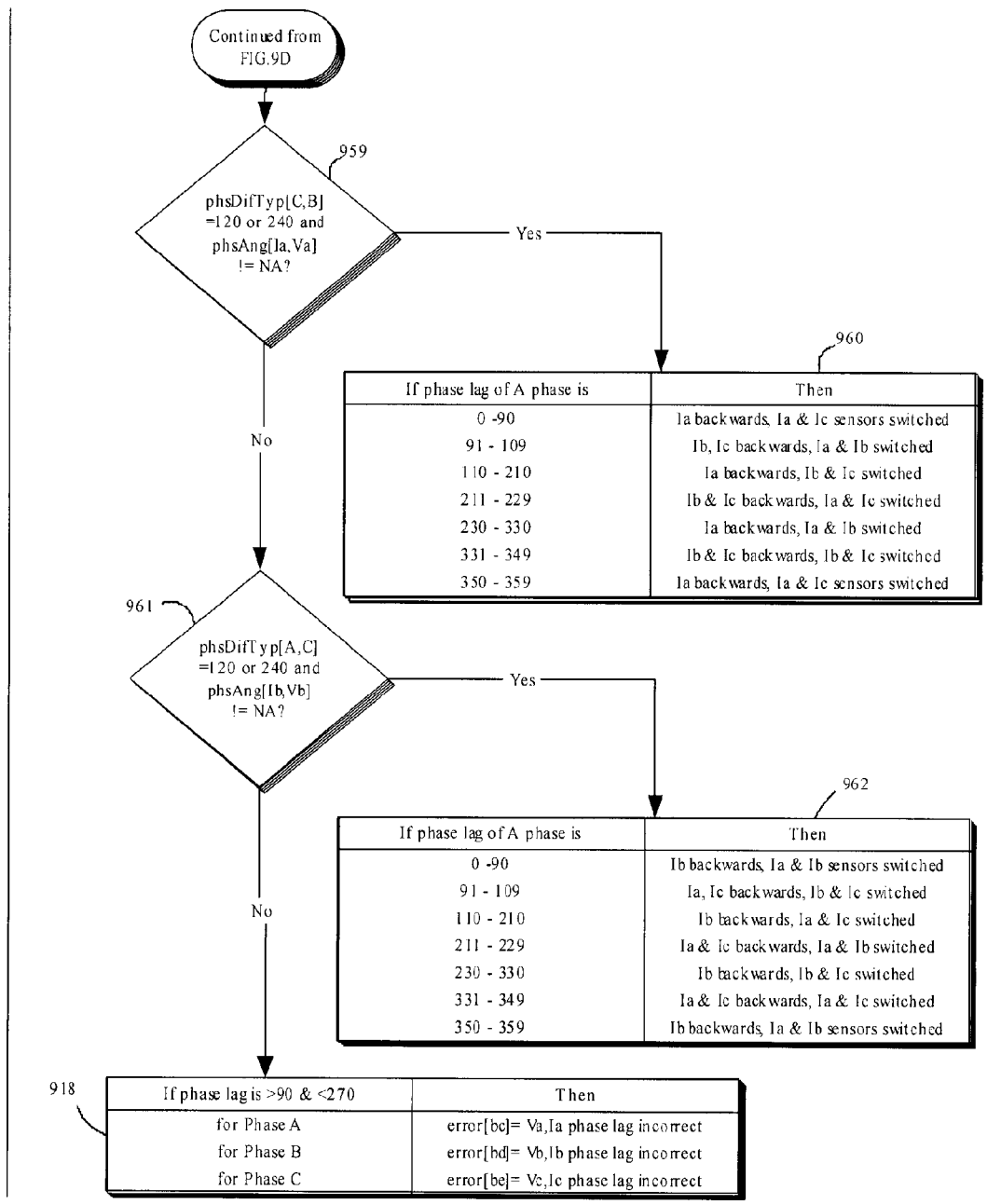

After step 937 the process moves to steps 910 and 938 on FIG. 9C. Step 910 tests for whether the current sensors are connected backwards in the context of no voltages present—a difficult situation to analyze. It may be established only that at least one current sensor is connected backwards. If step 910 is affirmative, step 938 makes that error determination. If the response is negative, step 912 checks for non-standard phase angles between the currents of the different phases in the absence of voltage signals. A non-standard phase angle in a three-phase system which is not a 4-wire Delta is probably a fault or a highly unusual power system.

After checking for non-standard phase angles in step 912, the process moves to steps 939, 941, 943 and 945 which test for instances where the same signal is being measured on more than one phase. Steps 940, 942, 944 and 946 are the corresponding error reporting steps. Then the process moves to step 947 which evaluate the presence of multiple current connection errors in a three-wire, three phase system.

Step 947 is the beginning of a sequence of steps 947-962 which evaluate eight possible situations of multiple current connection errors in a three-wire, three-phase system. The simplest situation occurs when the phase lag between voltage and current of each phase are basically the same, a likely characteristic of a correctly connected system. If the phase lag of each phase is from 0-90 degrees, the system may be resistive or inductive. If it is from 270-359 degrees, it may be capacitive. If it is from 91-269 degrees, the current sensor may be reversed. If it is from 120-210 degrees, the current sensor may be rotated right on an inductive circuit. If it is 30-11 g degrees, the current sensor may be rotated right on a capacitive circuit. If it is 240-330 degrees, the current sensor may be rotated left on an inductive circuit. If it is 150-239 degrees, the current sensor may be rotated left on a capacitive circuit. If it is 300-30 degrees, it may be reversed and rotated right on an inductive circuit. If it is 210-299 degrees, it may be reversed and rotated right on a capacitive circuit. If it is 60-150 degrees, it may be reversed and rotated left on an inductive circuit. If it is 330-59 degrees, it may be reversed and rotated left on a capacitive circuit. So even in this "ideal" situation, a common phase lag of 30 degrees could mean that the connections are correct on an inductive circuit, that the current sensor is connected to the next phase up on a capacitive circuit, that the current sensor is reversed and connected to the next conductor up on a capacitive circuit or may be reversed and connected to the next conductor down on an inductive circuit. The most likely among these possibilities is that the connections are correct. This judgment of the most likely scenario for any given phase lag combinations among the signals is important to the artificial intelligence rule base. There are eight specific phase difference circumstances that are evaluated in steps 947, 949, 951, 953, 955, 957, 959, and 961. For each of these circumstances, rules are laid down in corresponding steps 948, 950, 952, 954, 956, 958, 960 and 962 for the interpretation of any phase lag angle of a given phase. Better results are provided than most informed professionals can render and the results are automatic.

Finally at step 918, if a characterized signal set is somehow not evaluated by the eight situations, the set is examined to see if the phase lag of any of the phase is outside of the legal 270-90 degree limit of the real world, and any error is reported to the reporting module.

Figure 9G:
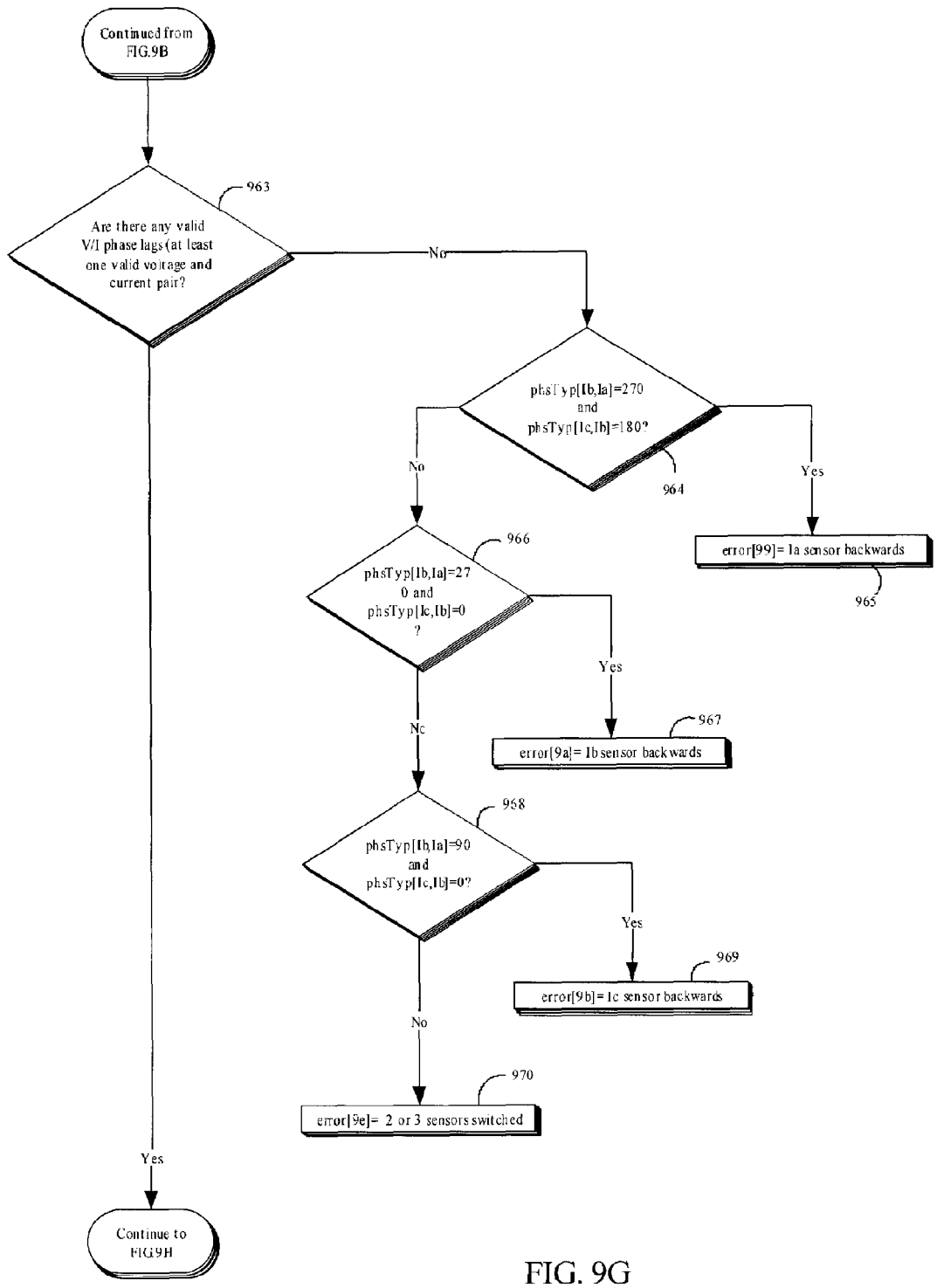
Figure 9H:
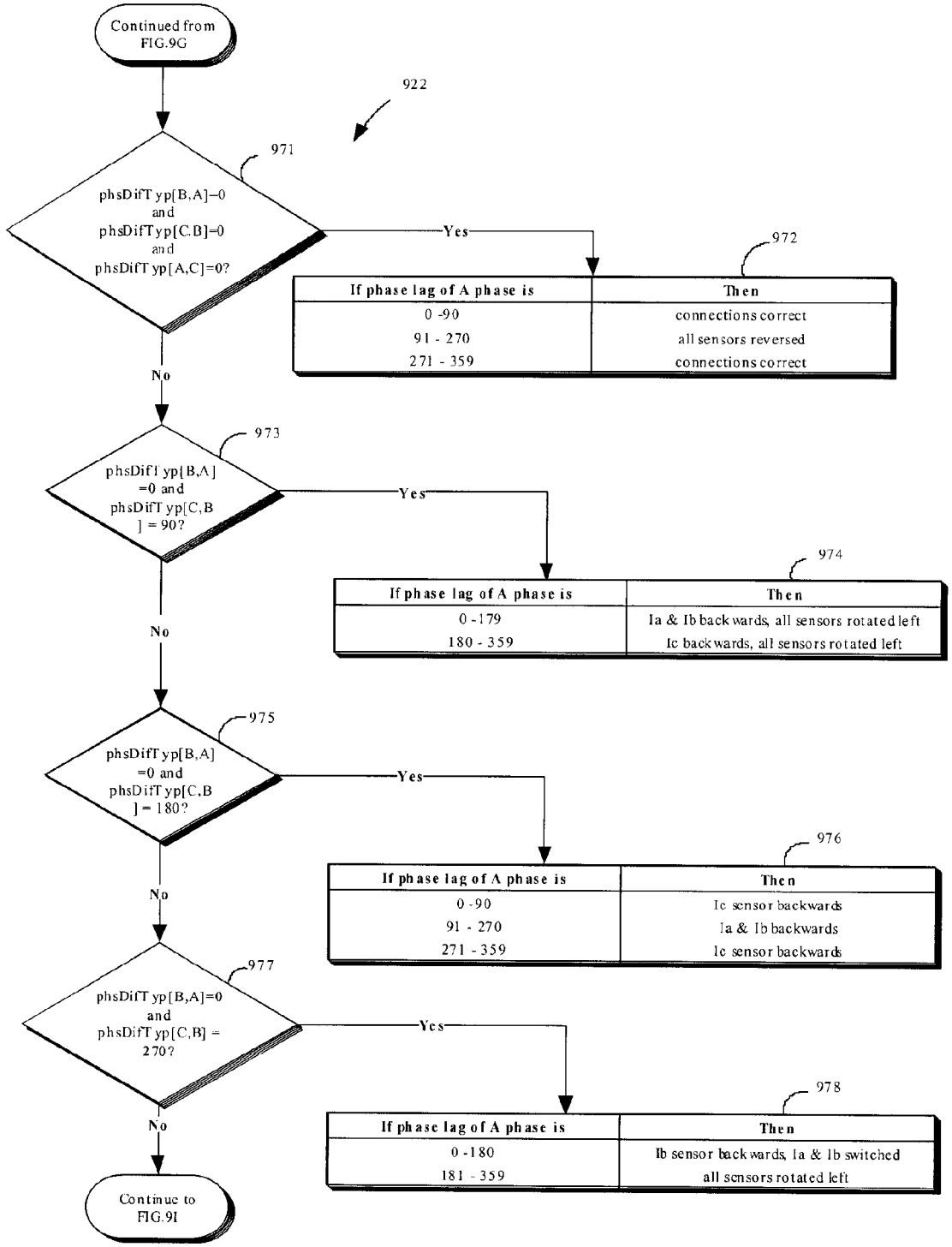
Figure 9I:
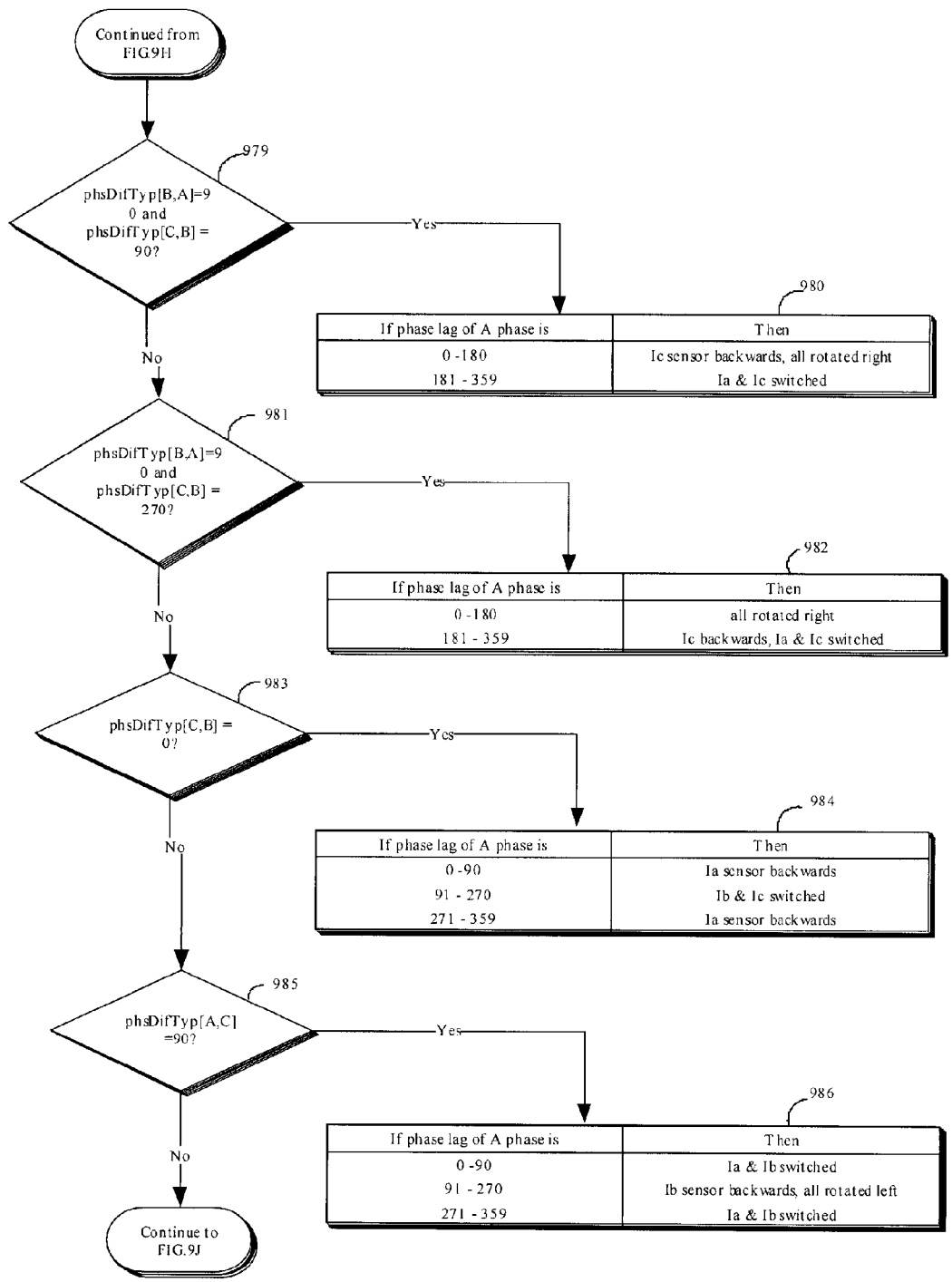
Figure 9J:
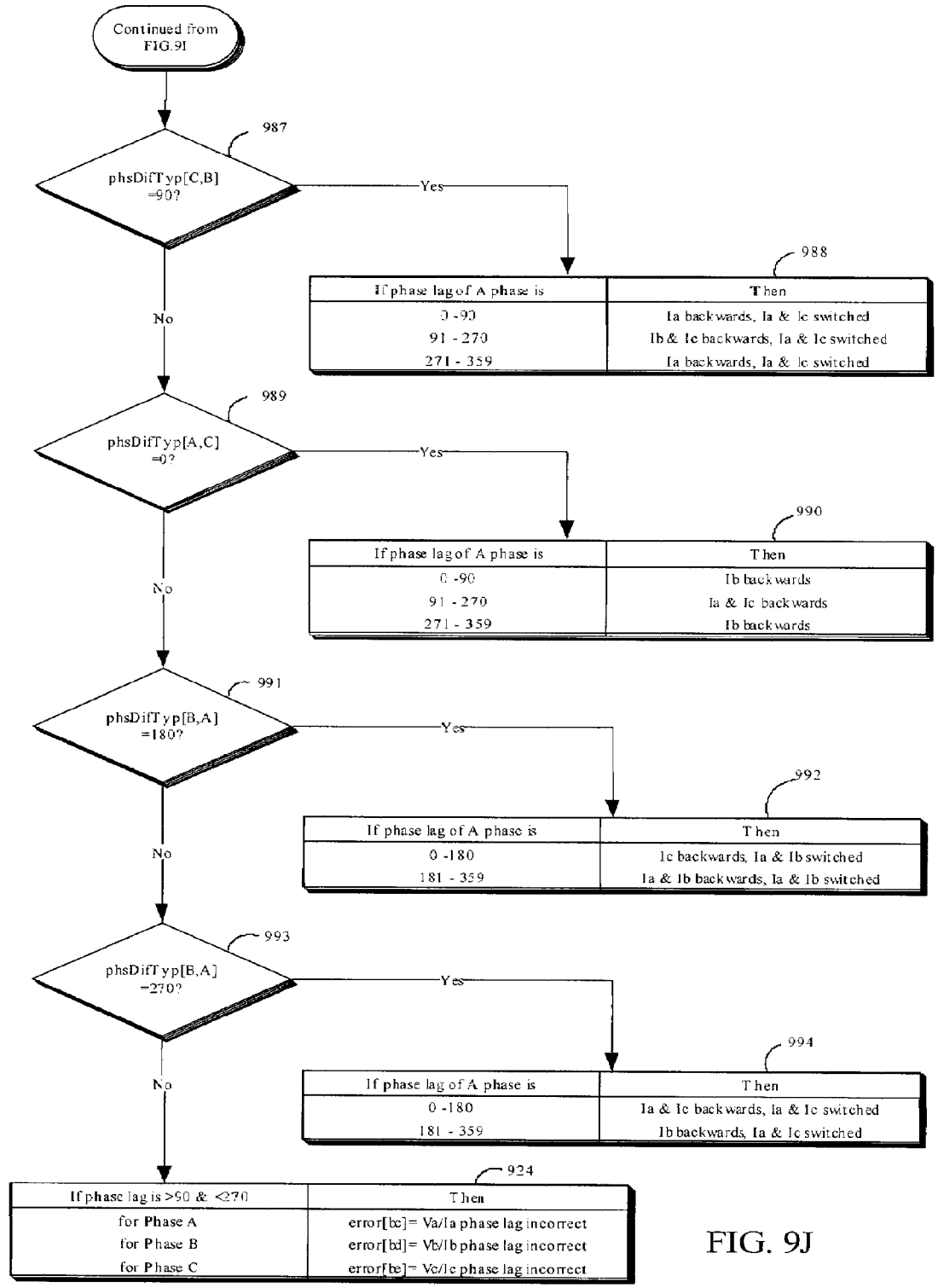

If a four-wire delta system type had been determined at step 935 on FIG. 9B, the process continues to test step 963 on FIG. 9G. If no valid Voltage/Current phase lag is found at step 963, the process moves to steps 964-970 which evaluates the 4-wire system without voltage inputs as best as possible in the same manner as done for the 3-wire, three-phase system earlier. If there is a positive response to step 963, the process moves to steps 971-994 where the 4-wire system is evaluated in this embodiment by 12 different phase lag difference situations. Although more situations are considered, the evaluation is less complex and the artificial intelligence rule base is less involved because there is less ambiguity about the explanation of a specific phase arrangement of signals in a 4-wire Delta system.

Finally, after proceeding through steps 964-970, step 924 is reached. As with the three-wire, three-phase evaluation, if a signal set does not get evaluated by one of the previous situations, the phase lags of each phase are evaluated to see if there is an illegal phase condition. If such is detected, it is reported to the reporting module as an error.

Hence the described measurement system can automatically determine the most likely power system that is connected to a circuit or system under test and the most likely connection or wiring errors present from measurements taken from the power system and the system under test.

Therefore, while the description above provides a full and complete disclosure of the preferred embodiments of the present invention, various modifications, alternate constructions, and equivalents will be obvious to those with skill in the art. For example, the described knowledge and rule bases are highly detailed and explicit for a powerful system which can determine a power system type, anomalies in the output of the power system, and wiring and connection errors knowledge bases in many different situations. It should be noted that a system with less elaborate knowledge and rule bases can have reduced capabilities without departing from the present invention. Thus, the scope of the present invention is limited solely by the metes and bounds of the appended claims.

What is claimed is:

1. A unitary device for evaluating measurement signals from a power system, said unitary device comprising:
a plurality of input terminals for receiving said measurement signals;
an identification subsystem reducing said measurement signals to characterized measurements and analyzing said characterized measurements with applied knowledge and rule bases to determine the type of said power system; and
a reporting subsystem receiving said determination results from said identification system and reporting out said determination results.

2. The device of claim 1 wherein said identification subsystem further comprises a power system knowledge base, a rule base, and a measurement processing module for reducing said measurement signals to characterized measurements, said rule base applying said power system knowledge base to said characterized measurements to determine the type of power system.

3. The device of claim 2 wherein said power system knowledge base includes standard DC power systems, standard single-phase power systems, standard two-phase power systems, standard three-phase Wye or Delta power systems and standard four-wire Delta power systems to determine said type of power system.

4. The device of claim 3 wherein said identification subsystem determines a nonstandard type of power system from said power system knowledge base.

5. The device of claim 1 wherein said identification subsystem further determines errors of connections and wiring of said power system.

6. The device of claim 5 wherein said errors of said connections and wiring include errors of connections and wiring of sensing components connected to said power system, said sensing components generating said measurement signals.

7. The device of claim 6 wherein said identification subsystem further comprises a wiring/connection knowledge base, a rule base, and a measurement processing module for reducing said measurement signals to characterized measurements, said rule base applying said wiring/connection knowledge base to said characterized measurements to determine said errors of connections and wiring of said power system.

8. The device of claim 1, said plurality of input terminals further for receiving said measurement signals from a system under test, wherein said identification subsystem further determines errors of connections and wiring of said system under test and said determination results reported out by said reporting subsystem are related to said system under test.

9. The device of claim 8 wherein said identification subsystem further comprises a wiring/connection knowledge base, a rule base, and a measurement processing module for reducing said measurement signals to characterized measurements, said rule base applying said wiring/connection knowledge base to said characterized measurements to determine said anomalies of the output of said power system and said errors of connections and wiring of said power system.

10. The device of claim 9 wherein said wiring/connection knowledge base includes switched sensing components, rotated sensing components, missing signals, identical signals, switched connections, nonstandard magnitudes of voltage or current, nonstandard phase angles, and out-of range frequencies to determine anomalies of the output of said power system and said errors of connections and wiring.

11. The device of claim 1 wherein said identification subsystem further determines anomalies in the output of said power system.

12. The device of claim 11 wherein said identification subsystem further comprises a wiring/connection knowledge base, a rule base, and a measurement processing module for reducing said measurement signals to characterized measurements, said rule base applying said wiring/connection knowledge base to said characterized measurements to determine said anomalies in the output of said power system.

13. The device of claim 5 wherein said identification subsystem further comprises a report module for reporting said determination results to said reporting system.

14. The device of claim 13 wherein said reporting system includes a display, said display showing said determination results.

15. A computer system for evaluating measurement signals from a power system, said computer system comprising:
at least one processor;
a memory storing said measurement signals;
an identification subsystem program instructing said at least one processor to reduce said measurement signals to characterized measurements and to analyze said characterized measurements with applied knowledge and rule bases to determine the power system type of said power system; and
a display receiving said determined results from said identification system program and capable of displaying said determined results to report out the same.

16. The computer system of claim 15 wherein said measurement signals stored in said memory are input directly from said power system.

17. The computer system of claim 15 wherein said measurement signals stored in said memory are input from another memory storing said measurement signals.

18. The computer system of claim 15 wherein said identification subsystem program further comprises a power system knowledge base, a rule base, and a measurement processing module for reducing said measurement signals to said characterized measurements, said rule base applying said power system knowledge base to said characterized measurements to determine the type of power system.

19. The computer system of claim 18 wherein said power system knowledge base includes standard DC power systems, standard single-phase power systems, standard two-phase power systems, standard three-phase Wye or Delta power systems and standard four-wire Delta power systems to determine said type of power system.

20. The computer system of claim 19 wherein said identification subsystem program determines a nonstandard type of power system from said power system knowledge base.

21. The computer system of claim 15 wherein said identification subsystem program further determines errors of connections and wiring of said power system.

22. The computer system of claim 21 wherein said errors of said connections and wiring include errors of connections and wiring of sensing components connected to said power system, said sensing components generating said measurement signals.

23. The computer system of claim 22 wherein said identification subsystem program further comprises a wiring/connection knowledge base, a rule base, and a measurement processing module for reducing said measurement signals to said characterized measurements, said rule base applying said wiring/connection knowledge base to said characterized measurements to determine said errors of connections and wiring of said power system.

24. The computer system of claim 21 wherein said identification subsystem program further determines anomalies in the output of said power system.

25. The computer system of claim 24 wherein said identification subsystem program further comprises a wiring/connection knowledge base, a rule base, and a measurement processing module for reducing said measurement signals to said characterized measurements, said rule base applying said wiring/connection knowledge base to said characterized measurements to determine anomalies in the output of said power system and said errors of connections and wiring of said power system.

26. The computer system of claim 25 wherein said wiring/connection knowledge base includes switched sensing components, rotated sensing components, missing signals, identical signals, switched connections, nonstandard magnitudes of voltage or current, nonstandard phase angles and out-of-range frequencies to determine said anomalies in the output of said power system and errors of connections and wiring.

27. The computer system of claim 15 wherein said identification subsystem program further determines anomalies in the output of said power system.

28. The computer system of claim 27 wherein said identification subsystem program further comprises a wiring/connection knowledge base, a rule base, and a measurement processing module for reducing said measurement signals to said characterized measurements, said rule base applying said wiring/connection knowledge base to said characterized measurements to determine said anomalies in the output of said power system.

29. The computer system of claim 15 wherein said identification subsystem program further comprises a report module for reporting said determination results to said reporting system, and wherein said reporting system includes a display, said display showing said determination results.

30. The computer system of claim 15 wherein said measurement signals include measurement signals from a system under test and wherein said identification subsystem determines the power system type of said system under test.

31. In a system for evaluating measurement signals from a power system, said system having a processor and code for instructing said processor to perform operations, said code comprising:
- a module for reducing said measurement signals to characterized measurements;
- a knowledge base of power system types;
- a rule base with rules by which said knowledge base of power system types is to be applied in a systematic manner; and
- a module for processing said characterized measurements by applying said knowledge and rule bases to determine the type of power system of said power system.

32. The code of claim 31 wherein said knowledge base of power system types includes at least one type selected from the group comprising standard DC power systems, standard single-phase power systems, standard two-phase power systems, standard three-phase Wye or Delta power systems and standard four-wire Delta power systems so that a power system of said at least one type is determined.

33. The code of claim 32 wherein said knowledge base of power system types includes all types from said group so that a power system from said all types is determined.

34. The code of claim 31 wherein said processing module determines a standard frequency of said power system from said characterized measurements.

35. The code of claim 31 wherein said processing module determines a phase lag between voltages or currents without determining a standard power system of said power system from said characterized measurements.

36. The code of claim 31 further comprising
a knowledge base of connection and wiring errors;
and wherein said rule base includes rules by which said knowledge base of connection and wiring errors is to be applied in a systematic manner; and said rule base further applies said knowledge base of connection and wiring errors to determine such errors with said power system.

37. The code of claim 36 wherein said errors of connections and wiring include errors of connections and wiring of sensing components connected to said power system, said sensing components generating said measurement signals.

38. The code of claim 36 wherein said rule base also applies said knowledge base of connection and wiring errors to determine anomalies in the output of said power system.

39. The code of claim 38 wherein said knowledge base of connection and wiring errors includes switched sensing components, rotated sensing components, missing signals, identical signals, switched connections, nonstandard magnitudes of voltage or current, nonstandard phase angles and out-of-range frequencies to determine said anomalies in the output of said power system and said errors of connections and wiring.

40. The code of claim 31 further comprising
a knowledge base of connection and wiring errors;
and wherein said rule base includes rules by which said knowledge base of connection and wiring errors is to be applied in a systematic manner; and said rule base further applies said knowledge base of connection and wiring errors to determine anomalies in the output of said power system.

41. The code of claim 31 further comprising a report module for reporting out said determination results from said processing module, and wherein said report module includes code for showing said determination results on a display.

42. The code of claim 31 wherein said measurement signals include measurement signals of a system under test, and wherein said module for processing said characterized measurements analyzes said system under test.

43. In a system for evaluating measurement signals from a power system, a method comprising:
- collecting measurement signals of said power system;
- reducing said measurement signals to characterized measurements; and
- analyzing said characterized measurements including applying a knowledge base of power system types and a rule base with rules by which said knowledge base of power system types is applied in a systematic manner;
whereby the type of power system is determined.

44. The method of claim 43 wherein said knowledge base of power system types includes at least one type selected from the group comprising standard DC power systems, standard single-phase power systems, standard two-phase power systems, standard three-phase Wye or Delta power systems and standard four-wire Delta power systems so that a power system of said at least one type is determined.

45. The method of claim 44 wherein said knowledge base of power system types includes all types from said group so that a power system from said all types is determined.

46. The method of claim 43 wherein said analyzing step includes determining a standard frequency of said power system from said characterized measurements.

47. The method of claim 43 wherein said analyzing step includes determining the phase lags between the voltage and current of each phase and the difference in the phase lag of each phase without determining a standard power system of said power system from said characterized measurements.

48. The method of claim 43 wherein said analyzing step includes:
- applying a knowledge base of connection and wiring errors;
- and wherein said rule base includes rules by which said knowledge base of connection and wiring errors is to be applied in a systematic manner so that connection and wiring errors in said power system are determined.

49. The method of claim 48 wherein said connections and wiring errors include errors of connections and wiring of sensing components connected to said power system, said sensing components generating said measurement signals.

50. The method of claim 49 wherein said rule base includes rules by which said knowledge base of connection and wiring errors is to be applied in a systematic manner so that anomalies in the output of said power system are determined.

51. The method of claim 50 wherein said knowledge base of connection and wiring errors includes switched sensing components, rotated sensing components, missing signals, identical signals, switched connections, nonstandard magnitudes of voltage or current, nonstandard phase angles and out-of-range frequencies to determine said connection and wiring errors.

52. The method of claim 43 wherein said analyzing step includes:
- applying a knowledge base of connection and wiring errors;
- and wherein said rule base includes rules by which said knowledge base of connection and wiring errors is to be applied in a systematic manner so that anomalies in the output of said power system are determined.

53. The method of claim 43 further comprising reporting out said determination results from said analyzing step, wherein said reporting out includes showing said determination results on a display.

54. The method of claim 53 wherein said collecting measurement signals further comprises collecting measurement signals of a system under test.

55. The method of claim 43 wherein said reducing step includes characterizing frequency of said power system as a predetermined standard of frequency, voltage magnitudes as live or dead, voltage magnitudes as equivalent or not, current magnitudes as live or dead, current magnitudes as equivalent or not, phase angles between voltages as standard or nonstandard; phase angles between currents as standard or nonstandard; differences in phase lag between voltages and their currents as standard or nonstandard; voltage configurations as predetermined different types; current configurations as predetermined different types; phase lags between voltages and currents as valid or not.

56. A unitary device for evaluating measurement signals of a power system, said unitary device comprising:
 a plurality of input terminals for receiving said measurement signals;
 an identification subsystem reducing said measurement signals to characterized measurements and analyzing said characterized measurements with applied knowledge and rule bases to determine errors of connections and wiring of said power system; and
 a reporting subsystem receiving said determination results from said identification system and reporting out said determination results.

57. The device of claim 56 wherein the type of power system is specified to said identification subsystem.

58. The device of claim 57 wherein said errors of said connections and wiring include errors of connections and wiring of sensing components connected to said power system or said system under test, said sensing components generating said measurement signals.

59. The device of claim 58 wherein said identification subsystem further comprises a wiring/connection knowledge base, a rule base, and a measurement processing module for reducing said measurement signals to characterized measurements, said rule base applying said wiring/connection knowledge base to said characterized measurements to determine said errors of connections and wiring of said power system.

60. The device of claim 57 wherein said identification subsystem further determines anomalies in the output of said power system.

61. The device of claim 60 wherein said identification subsystem further comprises a wiring/connection knowledge base, a rule base, and a measurement processing module for reducing said measurement signals to characterized measurements, said rule base applying said wiring/connection knowledge base to said characterized measurements to determine said anomalies in the output of said power system and said errors of connections and wiring of said power system.

62. The device of claim 61 wherein said wiring/connection knowledge base includes switched sensing components, rotated sensing components, missing signals, identical signals, switched connections, nonstandard magnitudes of voltage or current, nonstandard phase angles, and out-of range frequencies to determine anomalies in the output of said power system and said errors of connections and wiring.

63. The device of claim 57 wherein said identification subsystem further comprises a report module for reporting said determination results to said reporting system and wherein said reporting system includes a display, said display showing said determination results.

64. The device of claim 56, said measurement signals including measurement signals of a system under test, said identification subsystem further reducing said measurement signals to determine errors of connection and wiring of said system under test, said device comprising a handheld power analyzer.

65. A computer system for evaluating measurement signals from a power system, said computer system comprising:
 at least one processor;
 a memory storing said measurement signals;
 an identification subsystem program instructing said at least one processor to reduce said measurement signals to characterized measurements and to analyze said characterized measurements with applied knowledge and rule bases to determine errors of connections and wiring of said power system; and
 a display receiving said determined results from said identification system program and capable of displaying said determined results to report out the same.

66. The computer system of claim 65 wherein the type of power system is specified to said identification subsystem.

67. The computer system of claim 66 wherein said measurement signals stored in said memory are input directly from said power system.

68. The computer system of claim 66 wherein said measurement signals stored in said memory are input from another memory storing said measurement signals.

69. The computer system of claim 66 wherein said errors of said connections and wiring include errors of connections and wiring of sensing components connected to said power system, said sensing components generating said measurement signals.

70. The computer system of claim 69 wherein said identification subsystem program further comprises a wiring/connection knowledge base, a rule base, and a measurement processing module for reducing said measurement signals to said characterized measurements, said rule base applying said wiring/connection knowledge base to said characterized measurements to determine said errors of connections and wiring of said power system.

71. The computer system of claim 66 wherein said identification subsystem program further determines anomalies in the output of said power system.

72. The computer system of claim 71 wherein said identification subsystem program further comprises a wiring/connection knowledge base, a rule base, and a measurement processing module for reducing said measurement signals to said characterized measurements, said rule base applying said wiring/connection knowledge base to said characterized measurements to determine anomalies in the output of said power system and said errors of connections and wiring of said power system.

73. The computer system of claim 72 wherein said wiring/connection knowledge base includes switched sensing components, rotated sensing components, missing signals, identical signals, switched connections, nonstandard magnitudes of voltage or current, nonstandard phase angles and out-of-range frequencies to determine said anomalies in the output of said power system and errors of connections and wiring.

74. The computer system of claim 66 wherein said identification subsystem program further comprises a report module for reporting said determination results to said reporting system and wherein said reporting system includes a display, said display showing said determination results.

75. The computer system of claim 74 wherein said measurement signals include measurement signals of a system under test, said identification subsystem program instructing said at least one processor to analyze said characterized measurements to determine errors of connections and wiring of said system under test.

76. In a system for evaluating measurement signals from a power system, said system having a processor and code for instructing said processor to perform operations, said code comprising:
- a module for reducing said measurement signals to characterized measurements;
- a knowledge base of connection and wiring errors;
- a rule base with rules by which said knowledge base of connection and wiring errors is to be applied in a systematic manner; and
- a module for processing said characterized measurements by applying said knowledge and rule bases to determine errors of wiring and connection with said power system or to said.

77. The code of claim 76 wherein said code is operative with the type of said power system specified.

78. The code of claim 77 wherein said rule base includes rules by which said knowledge base of connection and wiring errors is to be applied in a systematic manner; and said rule base further applies said knowledge base of connection and wiring errors to determine such errors with said power system.

79. The code of claim 78 wherein said errors of connections and wiring include errors of connections and wiring of sensing components connected to said power system, said sensing components generating said measurement signals.

80. The code of claim 77 wherein said rule base also applies said knowledge base of connection and wiring errors to determine anomalies in the output of said power system.

81. The code of claim 80 wherein said knowledge base of connection and wiring errors includes switched sensing components, rotated sensing components, missing signals, identical signals, switched connections, nonstandard magnitudes of voltage or current, nonstandard phase angles and out-of-range frequencies to determine said anomalies in the output of said power system and said errors of connections and wiring.

82. The code of claim 77 further comprising a report module for reporting out said determination results from said processing module and wherein said report module includes code for showing said determination results on a display.

83. The code of claim 76 wherein said measurement signals include measurement signals of a system under test, and wherein said module for processing said characterized measurements further determines errors of wiring and connection with said system under test.

84. In a system for evaluating measurement signals from a power system, a method comprising:
- collecting measurement signals of said power system;
- reducing said measurement signals to characterized measurements; and
- analyzing said characterized measurements including applying a knowledge base of connection and wiring errors and a rule base with rules by which said knowledge base of connection and wiring errors is applied in a systematic manner;
- whereby connection and wiring errors in said power system are determined.

85. The method of claim 84 wherein the type of said power system is specified.

86. The method of claim 85 wherein said connections and wiring errors include errors of connections and wiring of sensing components connected to said power system, said sensing components generating said measurement signals.

87. The method of claim 86 wherein said rule base includes rules by which said knowledge base of connection and wiring errors is to be applied in a systematic manner so that anomalies in the output of said power system are determined.

88. The method of claim 87 wherein said knowledge base of connection and wiring errors includes switched sensing components, rotated sensing components, missing signals, identical signals, switched connections, nonstandard magnitudes of voltage or current, nonstandard phase angles and out-of-range frequencies to determine said connection and wiring errors.

89. The method of claim 85 wherein said rule base includes rules by which said knowledge base of connection and wiring errors is to be applied in a systematic manner so that anomalies in the output of said power system are determined.

90. The method of claim 85 further comprising reporting out said determination results from said analyzing step and wherein said reporting out includes showing said determination results on a display.

91. The method of claim 84 wherein said collecting further comprises collecting measurement signals of a system under test, whereby connection and wiring errors in said system under test are determined.

92. The method of claim 85 wherein said reducing step includes characterizing frequency of said power system as a predetermined standard of frequency, voltage magnitudes as live or dead, voltage magnitudes as equivalent or not, current magnitudes as live or dead, current magnitudes as equivalent or not, phase angles between voltages as standard or nonstandard; phase angles between currents as standard or nonstandard; differences in phase lag between voltages and their currents as standard or nonstandard; voltage configurations as predetermined different types; current configurations as predetermined different types; phase lags between voltages and currents as valid or not.

* * * * *